US009175812B2

(12) United States Patent
Jung et al.

(10) Patent No.: US 9,175,812 B2
(45) Date of Patent: Nov. 3, 2015

(54) LIGHTING APPARATUS

(75) Inventors: Byungsang Jung, Seoul (KR); Sejoon You, Seoul (KR); Kyungtaek Lee, Seoul (KR); Hyunha Kim, Seoul (KR); Seoyoung Maeng, Seoul (KR); Dongchul Yoo, Seoul (KR)

(73) Assignee: LG Electronics Inc., Seoul (KR)

( * ) Notice: Subject to any disclaimer, the term of this patent is extended or adjusted under 35 U.S.C. 154(b) by 319 days.

(21) Appl. No.: 13/312,012

(22) Filed: Dec. 6, 2011

(65) Prior Publication Data

US 2012/0300474 A1     Nov. 29, 2012

(30) Foreign Application Priority Data

May 25, 2011  (KR) .......................... 10-2011-0049556

(51) Int. Cl.
| | |
|---|---|
| *F21V 29/507* | (2015.01) |
| *F21K 99/00* | (2010.01) |
| *F21V 29/63* | (2015.01) |
| *F21V 29/77* | (2015.01) |
| *F21Y 101/02* | (2006.01) |
| *F21Y 103/02* | (2006.01) |

(52) U.S. Cl.
CPC ................. *F21K 9/13* (2013.01); *F21V 29/507* (2015.01); *F21V 29/63* (2015.01); *F21V 29/773* (2015.01); *F21Y 2101/02* (2013.01); *F21Y 2103/022* (2013.01)

(58) Field of Classification Search
CPC ....... F21K 9/13; F21V 29/773; F21V 29/507; F21V 29/63; F21Y 2101/02; F21Y 2103/022

USPC ............ 313/17, 20, 33, 46, 45; 362/480, 546, 362/547, 218, 294, 373, 555, 235, 249.01, 362/249.02; 439/487; 257/81
See application file for complete search history.

(56) References Cited

U.S. PATENT DOCUMENTS

| | | | |
|---|---|---|---|
| 6,499,854 B2 * | 12/2002 | Chen ............................. | 362/101 |
| 7,144,135 B2 * | 12/2006 | Martin et al. ................. | 362/294 |
| 2006/0193139 A1 * | 8/2006 | Sun et al. ...................... | 362/373 |
| 2007/0096118 A1 * | 5/2007 | Mahalingam et al. .......... | 257/81 |
| 2009/0084866 A1 | 4/2009 | Grimm et al. ..................... | 239/4 |
| 2009/0109625 A1 | 4/2009 | Booth et al. .................. | 361/702 |
| 2010/0124058 A1 * | 5/2010 | Miller ....................... | 362/249.02 |
| 2011/0074268 A1 * | 3/2011 | Liu et al. .......................... | 313/46 |
| 2011/0089830 A1 * | 4/2011 | Pickard et al. .................. | 315/32 |
| 2012/0008330 A1 * | 1/2012 | Horng et al. .................. | 362/373 |
| 2012/0098424 A1 * | 4/2012 | Arik et al. ....................... | 315/35 |
| 2012/0146481 A1 * | 6/2012 | Li et al. ........................... | 313/46 |

FOREIGN PATENT DOCUMENTS

| | | |
|---|---|---|
| DE | 10 2007 019 074 A1 | 10/2008 |
| JP | 2005-085808 A | 3/2005 |
| JP | 2011-507152 A | 3/2011 |
| KR | 10-2011-0032397 A | 3/2011 |
| WO | WO 2008/128635 A1 | 10/2008 |
| WO | WO 2011/109095 A2 | 9/2011 |
| WO | WO 2012/054115 A1 | 4/2012 |

OTHER PUBLICATIONS

International Search Report and Written Opinion dated Sep. 3, 2012 issued in Application No. PCT/KR2011/007181.
European Search Report dated Oct. 17, 2014 issued in Application No. 11 866 382.2.

* cited by examiner

*Primary Examiner* — Anh Mai
*Assistant Examiner* — Fatima Farokhrooz
(74) *Attorney, Agent, or Firm* — KED & Associates LLP

(57) ABSTRACT

A lighting apparatus can dissipate heat by conduction and convection. A heat sink is provided with an active cooling device for the lighting apparatus.

17 Claims, 26 Drawing Sheets

US 9,175,812 B2

LIGHTING APPARATUS

CROSS-REFERENCE TO RELATED APPLICATION(S)

This application claims priority under 35 U.S.C. §119 to Korean Application No. 10-2011-0049556, filed on May 25, 2011, whose entire disclosure is hereby incorporated by reference.

BACKGROUND

1. Field

The present invention relates to a lighting apparatus, more particularly, to a lighting apparatus having an active cooling system.

2. Background

There have been gradually increasing interests in a light emitting diode (LED) having advantages of light-emitting efficiency, color variety and design autonomy. Further, LEDs use less power resulting in less power usage for a greener environment. The light emitting diode (LED) is a semiconductor device which emits light when a voltage is applied thereto. The light emitting diode (LED) has a long usage life, low power consumption, with electrical, optical and physical properties for mass production. However, heat generated by the LED may deteriorate the luminescence efficiency and lifespan. A heat sink including a radiation fin is used in a lighting apparatus having the light emitting diode to alleviate such problems, but heat sinks may be insufficient.

The above references are incorporated by reference herein where appropriate for appropriate teachings of additional or alternative details, features and/or technical background.

SUMMARY OF THE DISCLOSURE

An active cooling system dissipates heat generated by a lighting assembly or lighting device.

BRIEF DESCRIPTION OF THE DRAWINGS

The embodiments will be described in detail with reference to the following drawings in which like reference numerals refer to like elements wherein.

DETAILED DESCRIPTION

Figure 1:
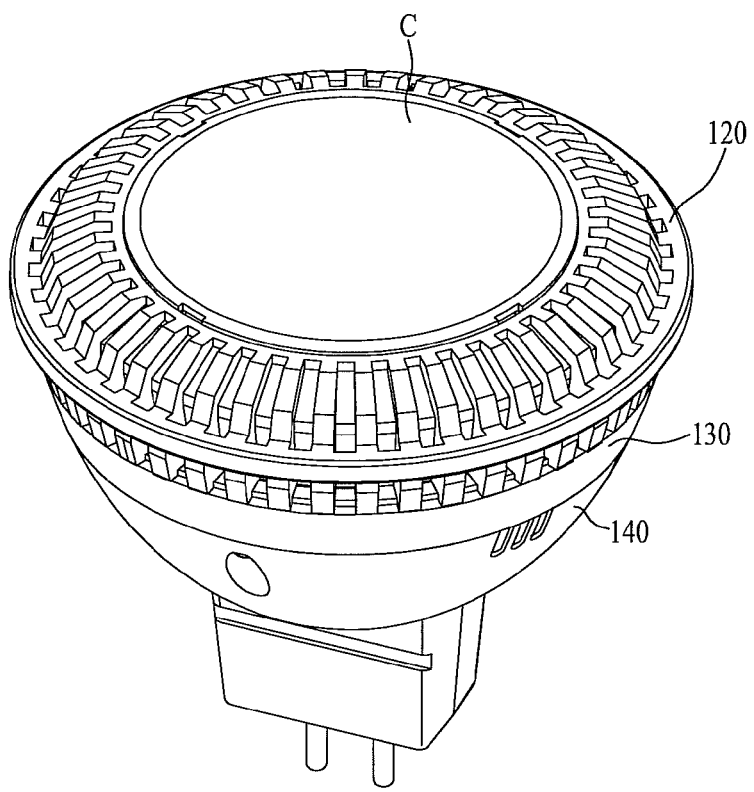
FIG. 1 is a perspective view illustrating a lighting apparatus according to an embodiment of the present disclosure.
Figure 2:
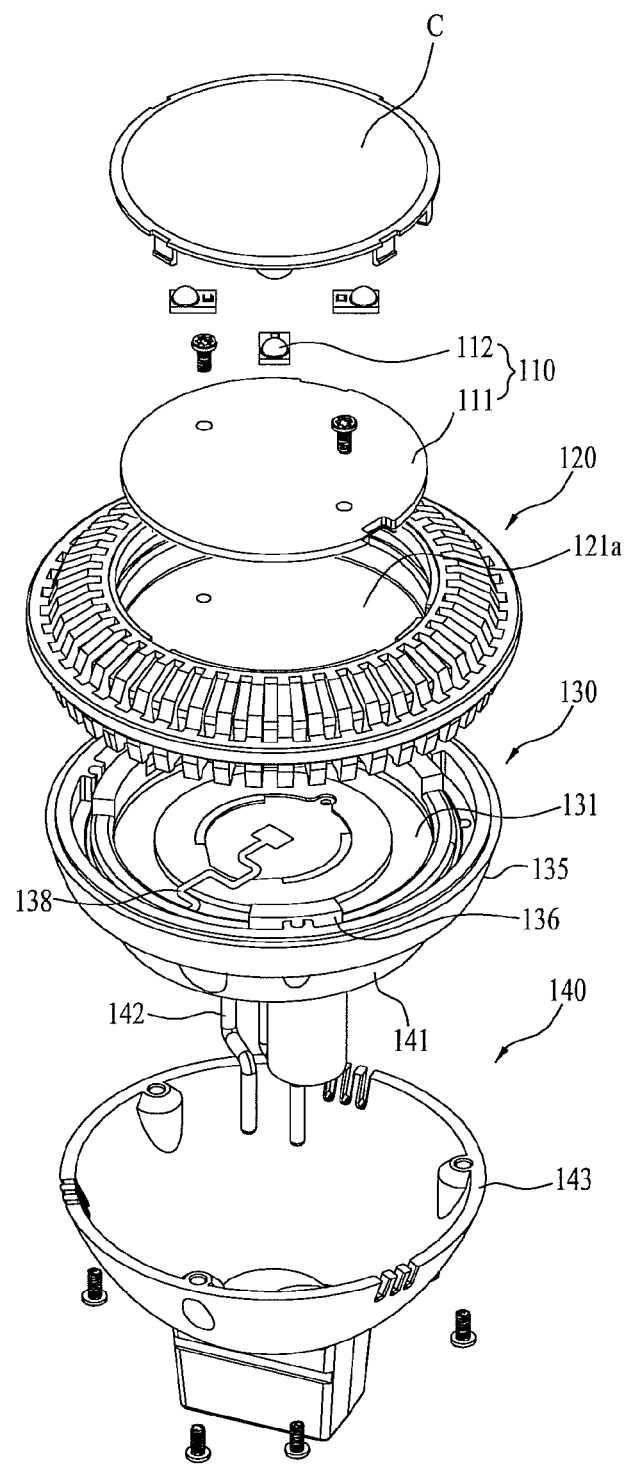
FIG. 2 is an exploded perspective view illustrating the lighting apparatus according to the present disclosure.
Figure 3:
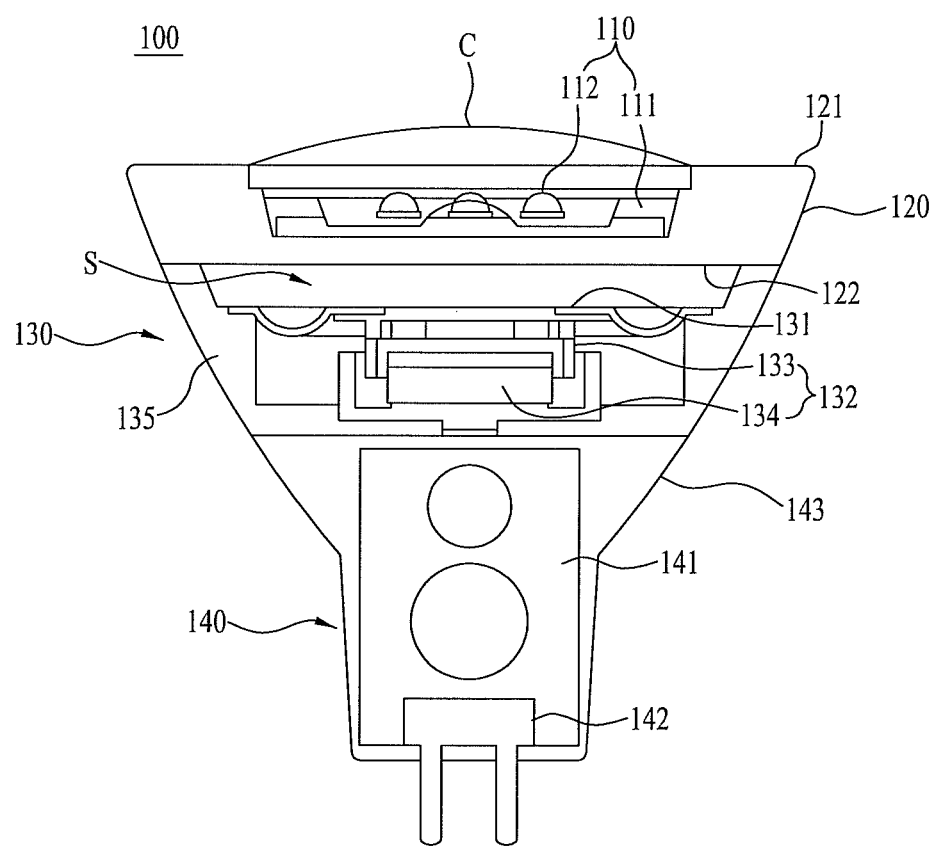
FIG. 3 is a sectional view illustrating the lighting apparatus according to the embodiment of the present disclosure.

FIG. 1 is a perspective view illustrating a lighting apparatus according to a first embodiment. FIG. 2 is an exploded perspective view illustrating the lighting apparatus. FIG. 3 is a sectional view illustrating the lighting apparatus. The lighting apparatus 100 includes a light emitting module 110, a heat sink 120 where the light emitting module is mounted and an active cooling device 130 mounted to the heat sink 120 using a space (S) is formed between the heat sink 120 and the fluid generator. The mounting may be done by appropriate fasteners, e.g., screws, glue, tape, etc.

The active cooling device 130 generates fluid movement, e.g., airflow, used to dissipate the heat of the heat sink 120 by changing a volume of the space (S). When the volume of the space (S) increases, external air is drawn into the space (S). When the volume of the space (S) decreases, internal air of the space (S) is discharged outside.

The light emitting module 110 includes a substrate 111 and at least one light emitting element such as a light emitting diode LED 112 mounted on the substrate 111. The light emitting module 110 may include a Chip On Board (COB)

LED or a thin GaN LED. According to the thin GaN LED, a light emitted from an active layer is reflected by a reflection plate located under the active layer perpendicularly to be emitted upwardly. The thin GaN LED has excellent radiation and high power properties.

A diffusion cover (C) or lens configured to diffuse a light radiated from the light emitting module 110 or to guide a path of the emitted light may be coupled to the heat sink 120 to surround a recess part 121a. The cover (C) may be translucent or transparent. The cover may be also coated with phosphor.

A reflection member (not shown) may be mounted to or a reflection layer may be formed on a surface of the light emitting module 110 and an inner circumferential surface of the recess part 121a to project substantially all of the lights radiated from the light emitting module 110 outside via the diffusion cover (C), without being absorbed by the substrate 110 or the recess part 121a of the first surface 121. The reflection member may have a plurality of holes to expose only the LED elements 112 and the reflection member may substantially cover all areas of the surface of the light emitting module 110, except the LED elements 112.

The active cooling device 130 may include a housing 135 mounted to the second surface 122 of the heat sink 120, a diaphragm 131 arranged in the housing 135 and a driving part 132 configured to vibrate the diaphragm 131.

The housing 135 may be divided into the upper space and the lower space by the diaphragm 131. In the upper space may include the holder 136 and the space (S). The lower space may include an electronic module 140 electrically connected with the light emitting module 110 and the active cooling device 130.

The electronic module 140 may include a case 143 having a socket 142 to be connected with an external power supply and a circuit part 141 provided in the case 143 and a plurality of cables for connecting the circuit part 141, the driving component 132 of the active cooling device and the light emitting module 110 with each other.

The case 143 may be integrally formed with the housing 135 or it may be fabricated independently for assembly between the case 143 and each of the parts provided in the housing 135 (that is, the active cooling device and the electronic module).

The cables may be flexible circuit substrates (FPCB) and one of the cables connected with the driving component 132 may be drawn toward the upper space from the lower space, to be electrically connected with a pad 138 (FIG. 11) on an upper surface of the diaphragm 131. The cable should not interfere with the vibration of the diaphragm 131 which is generated by the electromagnetic force of the coil 133 and the magnet 134.

Figure 4:
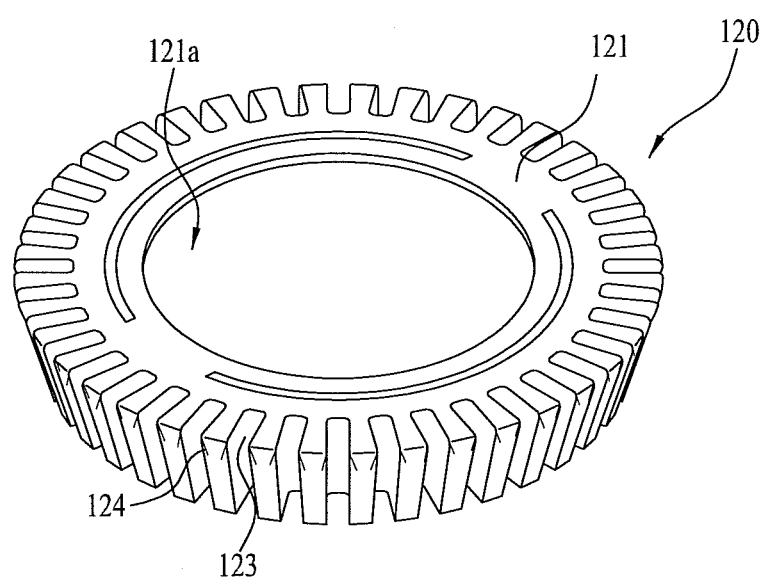
FIG. 4 is a perspective view illustrating a heat sink provided in the lighting apparatus according to the embodiment of the present disclosure.
Figure 5:
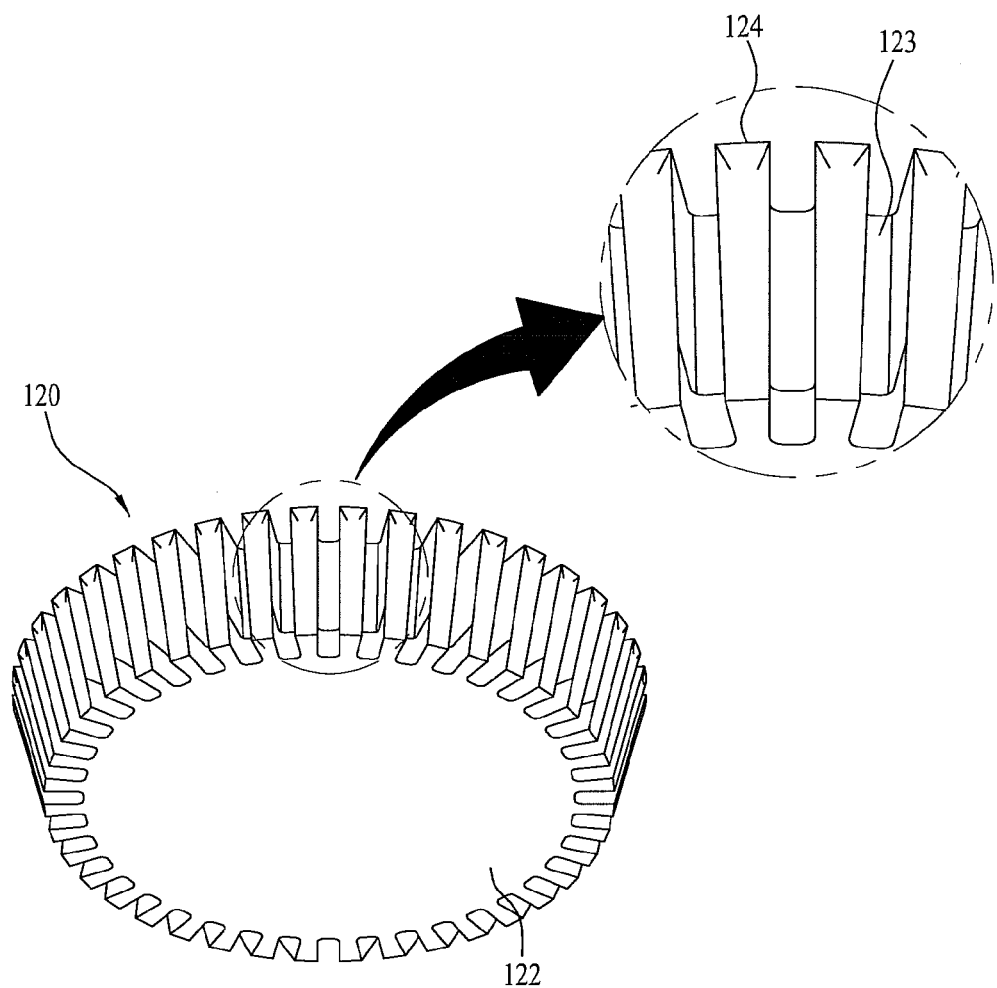
FIG. 5 is a perspective view illustrating the heat sink provided in the lighting apparatus according to the embodiment of the present disclosure.
Figure 6:
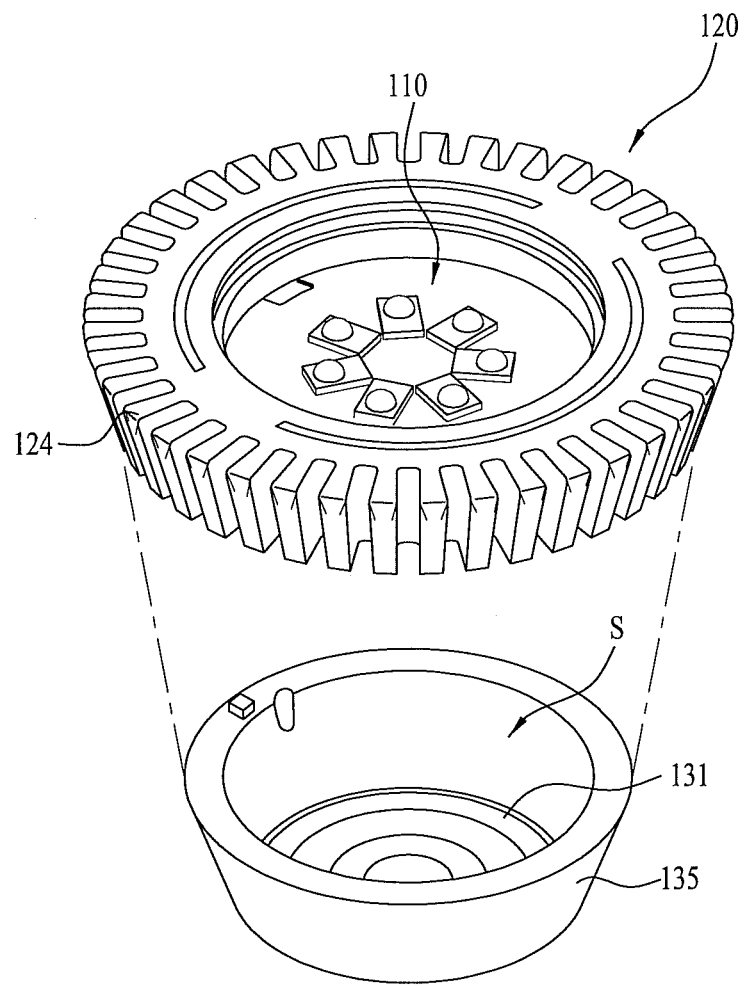
FIG. 6 is an exploded perspective view illustrating the heat sink and an active cooling device provided in the lighting apparatus according to the embodiment of the present disclosure.
Figure 7:
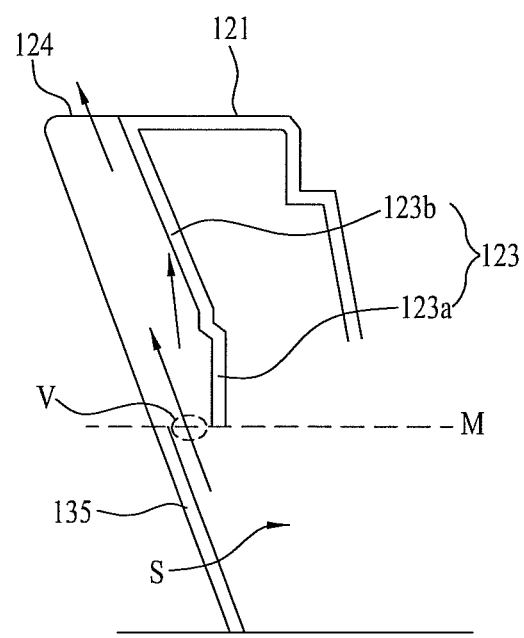
FIG. 7 is a sectional view illustrating the parts shown in FIG. 6 which are coupled to each other.
Figure 8:
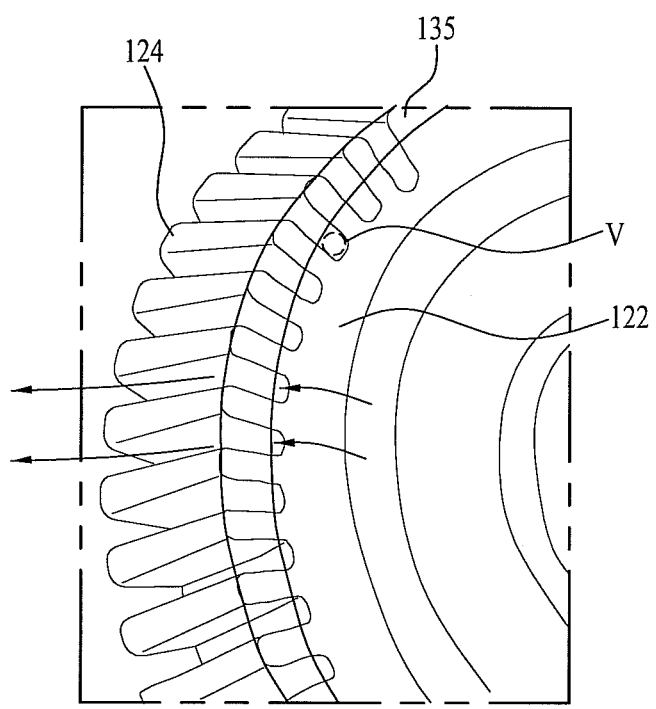
FIG. 8 is a partial perspective view illustrating the parts shown in FIG. 6 which are coupled to each other.

FIG. 4 is a perspective view illustrating the heat sink provided in the lighting apparatus 100. FIG. 5 is a perspective view illustrating the heat sink 120 provided in the lighting apparatus 100. FIG. 6 is an exploded perspective view illustrating the heat sink 120 and the active cooling device 131 provided in the lighting apparatus 100. FIG. 7 is a sectional view illustrating the fluid flow between. FIG. 8 is a partial exploded view of the heat sink 120.

The heat sink 120 may include a circular plate shaped or cylindrical shaped body and a plurality of radiation fins 124 formed at an outer circumferential surface 123 of the body. The body includes a first surface 121 where the light emitting module 110 is mounted, a second surface 122 located in opposite to the first surface 121 and an outer circumferential surface 123. The heat sink 120 may include a recess part 121a formed in the first surface 121 and the light emitting module 110 may be mounted in the recess part 121a.

The heat sink 120 may be formed of a metal material with high heat conductivity and/or light weight. When the light emitting module 110 is operated, the heat sink 120 is functioned to sink the heat generated from the light emitting module 110 and dissipate the heat. As it is related to an external design of the lighting apparatus 100, the heat sink 120 may be configured to have a variety of profiles in consideration of a design characteristic. For example, the fins 124 may be omitted.

In reference to FIG. 6, the heat sink 120 may be mounted to the housing 135, with the radiation fins 124 seated on the housing 135. External air may be drawn into the space (S) located between the heat sink 120 and the diaphragm 131 via a boundary between the housing 135 and the heat sink 120. Internal air of the space (S) may be discharged outside via the boundary between the housing 135 and the heat sink 120.

As illustrated in FIG. 7, a slope portion 123b may be provided in the outer circumferential surface 123 of the heat sink 120 to deflect the air discharged outside via the vent (V) from the space (S) of the housing 135. The slope portion 123b may be oblique downwardly toward the housing 135.

The outer circumferential surface 123 of the heat sink 120 may be divided into a parallel portion 123a which is substantially in parallel to a direction of the air suction and air discharge performed via the vent (V) and the slope portion 123b which is slope a predetermined angle with respect to the parallel portion 123a. Alternatively, the entire portion of the outer circumferential surface 123 may be the slope portion 123b. The slope portion 123b may function to deflect the air discharged outside via the vent (V) from the space (S) with the outer circumferential surface 123 of the heat sink 120, and may enhance heat dissipation.

In reference to FIGS. 7 and 8 of the heat sink 120 a vent (V) may be formed by the area difference between the fins 124 of the heat sink 120 and the wall thickness of the housing 135 at a boundary (M) between the heat sink 120 and the housing 135. The extensions or protrusions of the fins 124 from the outer circumference surface 123 of the heat sink 120 is longer than the wall thickness of the housing 135 and hence, vents (V) are provided between. The vent (V) is formed naturally in the structure seating the heat sink 120 on the housing 135 of the active cooling device 130. Hence, a manufacture resource quantity per unit and a production cost which are required to form the vent (V) additionally may be reduced.

The vibration of the diaphragm 131 of the active cooling device 130 may generate airflow inside the space (S). External air may be drawn into the space (S) after passing a space formed between adjacent fins 124 and the vent (V). External air of the space (S) may be discharged outside after passing a space formed between the vent (V) and adjacent radiation fins 124.

Figure 9:
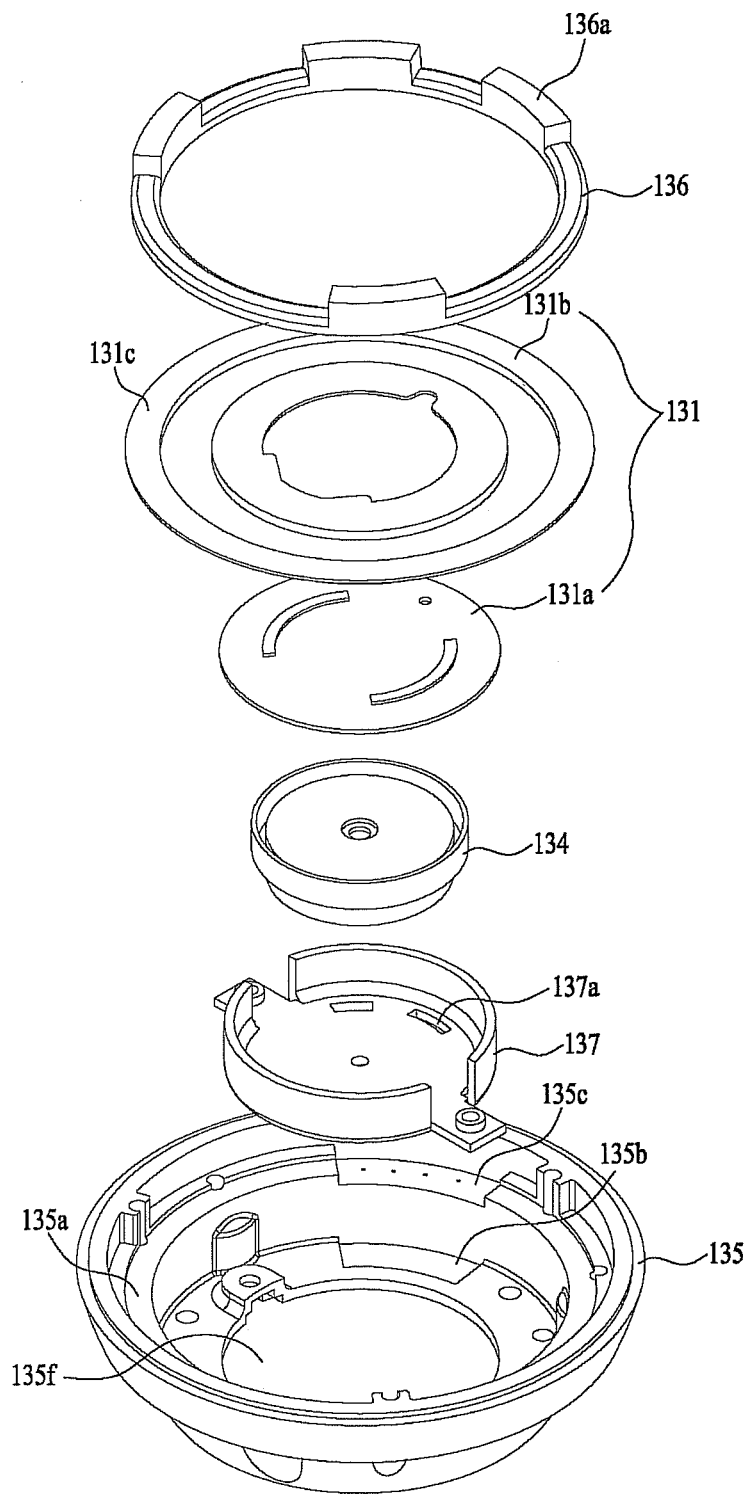
FIGS. 9 and 10 are exploded perspective views illustrating the active cooling device provided in the lighting apparatus according to the embodiment of the present disclosure.
Figure 10:
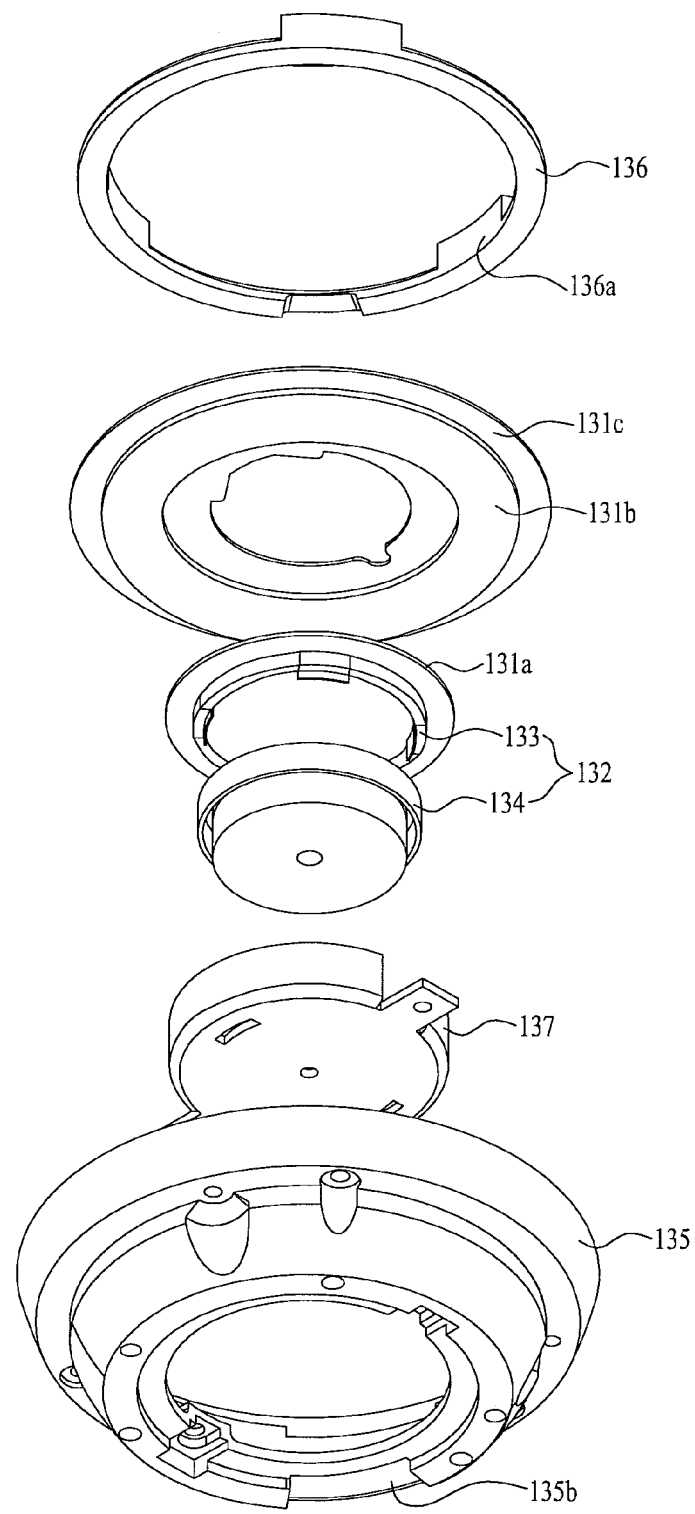
Figure 11:
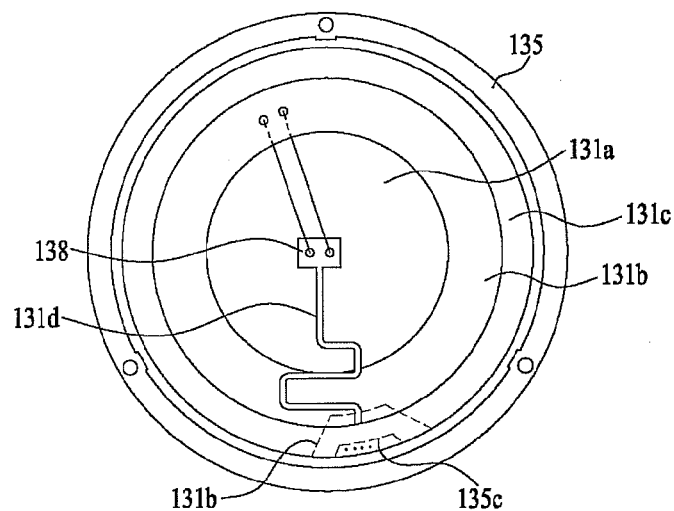
FIG. 11 is a plane view illustrating the active cooling device in a state of parts shown in FIG. 13 being coupled to each other.
Figure 12:
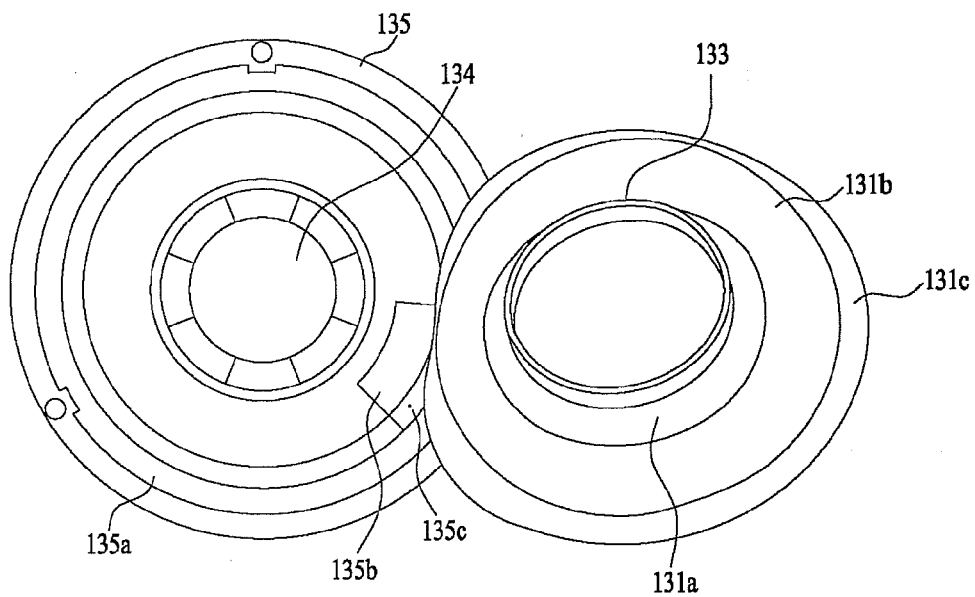
FIG. 12 is a perspective view illustrating some of the parts provided in the active cooling device shown in FIG. 15 being separated.

FIGS. 9 and 10 are exploded perspective views illustrating the active cooling device 130 provided in the lighting apparatus 100 according to the embodiment. FIG. 11 is a plane view of the active cooling device 130 and FIG. 12 is a perspective view illustrating the active cooling device where some parts shown in FIG. 11 being separated.

The active cooling device 130 may include the housing 135 (mounted to the second surface 122 of the heat sink 120), the diaphragm 131 arranged in the housing 135 and the driving component 132 for vibrating the diaphragm 131. The driving component 132 may include a coil 133 mounted to the diaphragm 131 and a magnet 134 mounted in the housing 135.

The diaphragm 131 may include a solid region 131a (e.g., a non-flexible plate) located in a center thereof and a flexible region 131b attached and extended from the solid region 131a along a radial direction. A longitudinal end portion 131c of the flexible region 131b may contact with an inner circumferential surface of the housing 135.

The solid region 131a may be formed of resin, plastic or ceramic and the flexible region 131b formed of rubber having a prescribed elasticity. The solid region 131a and the flexible region 131b are assembled (e.g., glued) to fabricate the diaphragm 131.

As the longitudinal end portion 131c of the flexible region 131b provided in the diaphragm 131 contacts the inner circumferential surface 135a of the housing 135, the space (S) located between the heat sink 120 and the diaphragm 131 is in communication with the outside only via the vent (V). Due to the seal between the portion 131c and the surface 135a, the air suction and discharge via the vent (V) may be smoothly and efficiently performed by the vibration of the diaphragm 131.

The coil 133 is mounted to the solid region 131a of the diaphragm 131. The solid region 131a moves close to and away from the magnet 134, which is fixed to the inside of the housing 135, by the electromagnetic force between the coil 133 and the magnet 134. The flexible region 131b of the diaphragm 131 allows movement of the solid region 131a toward and away from the magnet 134 based on changing magnetic field caused by alternating current flow through the coil 133 when an alternating voltage is applied to the coil. As can be appreciated, the alternating magnetic filed creates either attraction or repulsion between the magnetic field of the coil 133 and the magnet which has a fixed magnetic polarity, e.g., north or south. The repetitive attraction and repulsion and the flexible region 131b allows the solid region 131a to vibrate up and down. The vibration changes the volume of the space (S).

The diaphragm 131b includes a recessed region between the edge portion 131c and an inner portion. The inner portion has dimensions substantially similar to the solid portion 131a. The inner portion may include an opening. The solid portion 131a is attached to the inner portion by appropriate fasteners.

The housing 135 may include a seating part 135a to arrange the diaphragm 131 spaced apart a predetermined distance from the magnet 134. An edge portion 131c of the flexible region provided in the diaphragm 131 may be seated on the seating part. The edge portion 131c may be optionally glued to the seating part 135a. While the diaphragm 131 moves toward the magnet 134 and away from the light emitting module 110, the edge portion 131c is prevented from moving from the original position.

The active cooling device 130 may include a frame 137 attached to the housing 135 using appropriate fasteners. The frame 137 may have openings 137a. The magnet 134 is attached to the frame 137 using fasteners, e.g., a screw through openings in the magnet and the frame 137. The frame 137 may be made of metal. The magnet 134 fixed to the frame 137.

Further, a holder 136 fixes the edge portion 131c of the flexible region of the diaphragm 131. The holder 136 prevents the edge portion 131c from moving from the position toward the light emitting module 110 during the vibration of the diaphragm 131. The holder 136 may include a plurality of projections 136a to allow a predetermined portion thereof to have the same height as the height of the space (S) of the housing. The plurality of the projections 136a may contact with the second surface 122 of the heat sink 120.

As shown in FIGS. 11 and 12, the housing 135 includes an opening 135b to allow flexible PCB (FPCB) wiring and other types of appropriate wiring from electronic module 140 to supply an AC voltage to the coil and a DC voltage to the LEDs. An FPCB 131d is provided on the top of the diaphragm 131b with a bonding pad 138 near the middle of the solid portion 131a. Two wires extend from the bonding pad and extend through a hole or holes in the solid portion 131a to connection to the coil 133 on the bottom side of the solid portion 131a. The housing 135 may include a bonding pad 135c adjacent to the opening 135b and adjacent to or at the seat part 135a to provide electrical bonding of wires from the LEDs and the FPCB 131d and the FPCB from the electronic module 140.

Figure 13A:
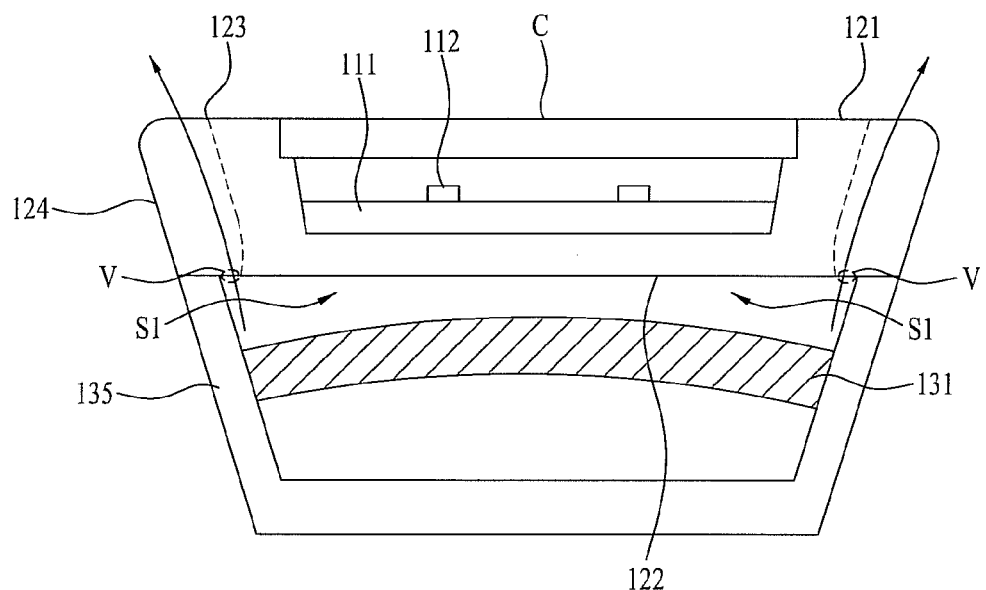
FIGS. 13A and 13B are diagrams to illustrate operational states of the active cooling system 130 according to the embodiment of the present disclosure.
Figure 13B:
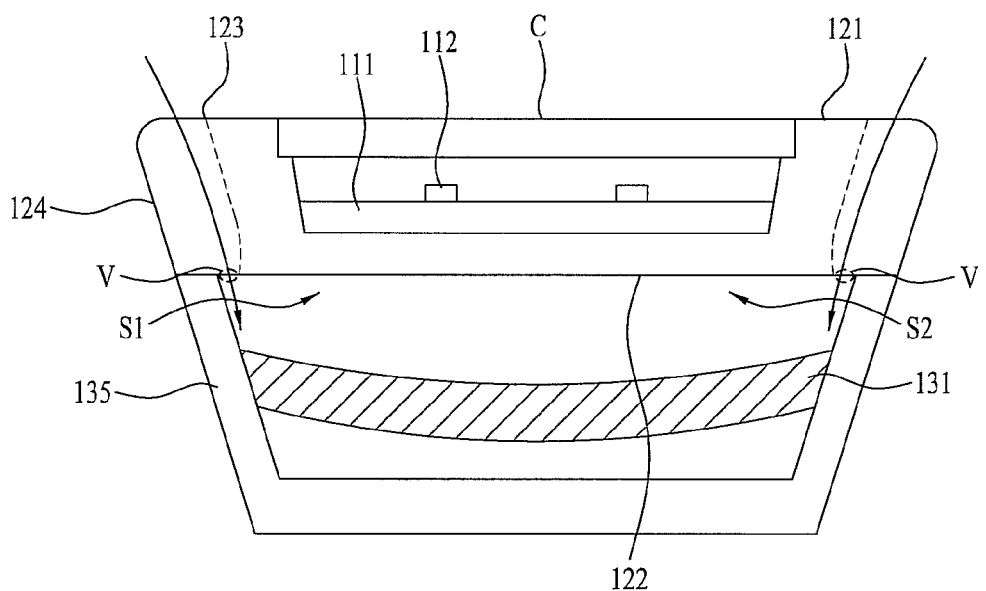

FIGS. 13A and 13B are illustrations explaining the operational state of the active cooling device 130 according to an embodiment of the present disclosure. In FIG. 13A, when the diaphragm 131 moves toward the light emitting module 110, the volume of the space (S) is decreasing (S→S1) and a pressure difference between the space (S) and the outside discharges the air in the space to outside via the space formed between the vent (V) and neighboring two of the radiation fins 124. As shown in FIG. 13B, when the diaphragm 131 moves toward an opposite direction of the light emitting module 110, the volume of the space (S) is increasing (S→S2), a pressure difference between the space (S) and the outside sucks outside air into the space (S) via two of the radiation fins 124 and the vent (V). Heat-exchange is performed between the outer circumferential surface and the second surface 122 of the heat sink 120 between the radiation fins 124 and the sucked and discharged air by air convection.

Figure 14:
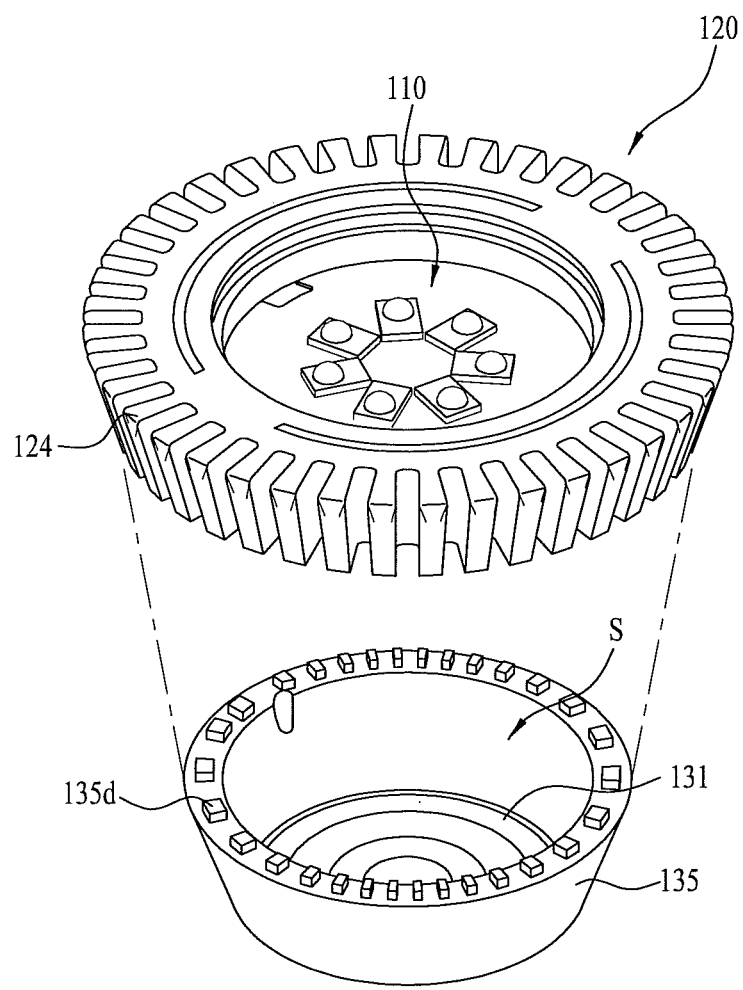
FIG. 14 is an exploded perspective view illustrating a lighting apparatus according to another embodiment of the present disclosure.
Figure 15A:
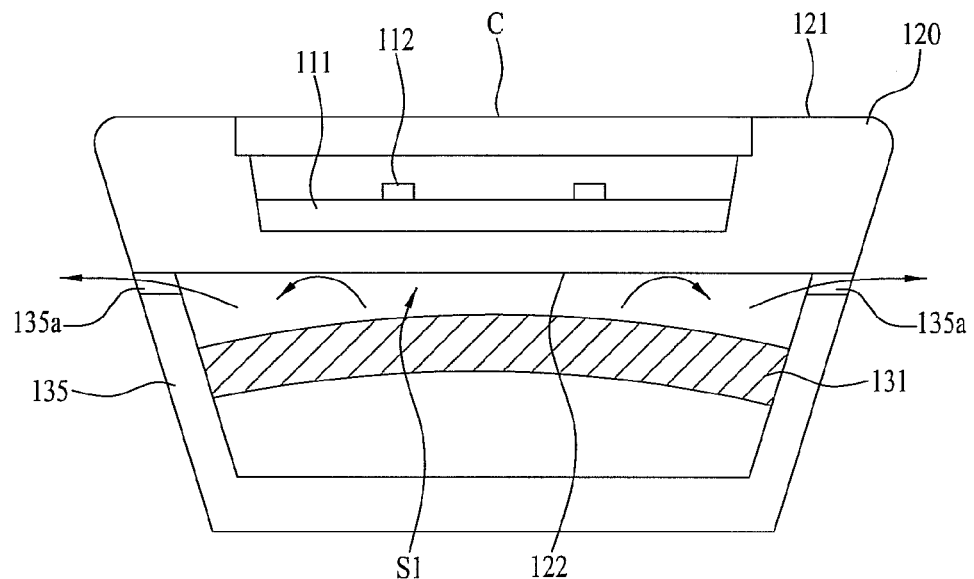
FIGS. 15A and 15B are illustrations to explain operational states of an active cooling device provided in the lighting apparatus.
Figure 15B:
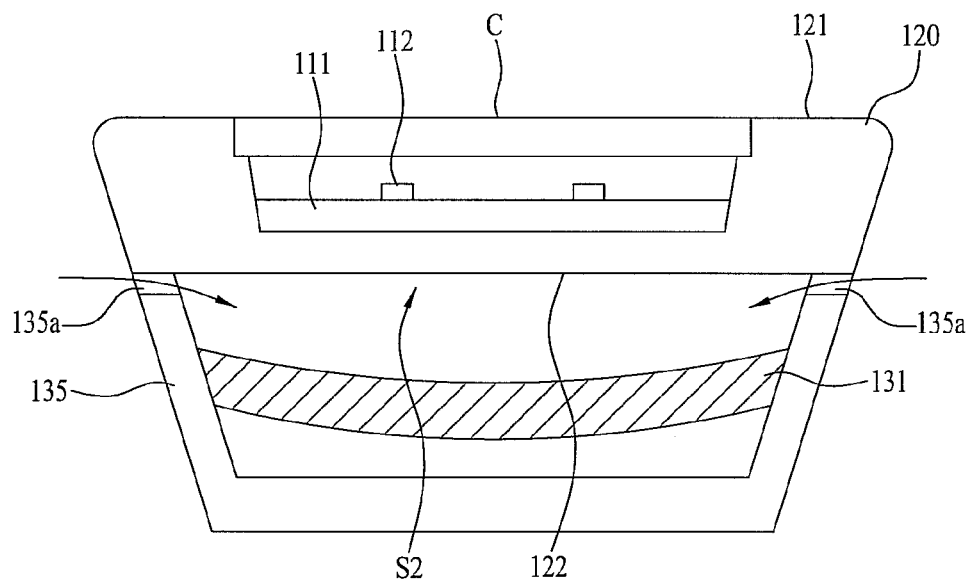

FIG. 14 is an exploded perspective view partially illustrating a lighting apparatus according to another embodiment of the present disclosure and FIGS. 15A and 15B are illustrations to explain operational states of an active cooling device provided in the lighting apparatus shown in FIG. 14.

Like the lighting apparatus 100 mentioned above in reference to the embodiment, the vent (V) may be formed by the difference of the sectional areas between the housing 135 and the second surface of the heat sink 120 to suck and discharge air via the boundary between the housing 135 and the heat sink 120. Alternatively or in addition thereto, a plurality of projections 135d may be provided on the housing to form a larger vent for suction and discharge of air via a boundary between the heat sink 120 and the housing 135. The plurality of the projections may be alternatively formed at a second surface 122 of the heat sink 120 along a circumferential direction.

In reference to FIGS. 15A and 15B, when a diaphragm 131 is expanded toward a light emitting module 110, external air may be sucked into a space (S1) via a predetermined space formed between neighboring two projections 135d (without vents (V) between adjacent fins). When the diaphragm 131 is expanded toward an opposite direction of the light emitting module 110, internal air of the space (S2) may be discharged outside via a space formed between neighboring two projections 135d.

Figure 16A:
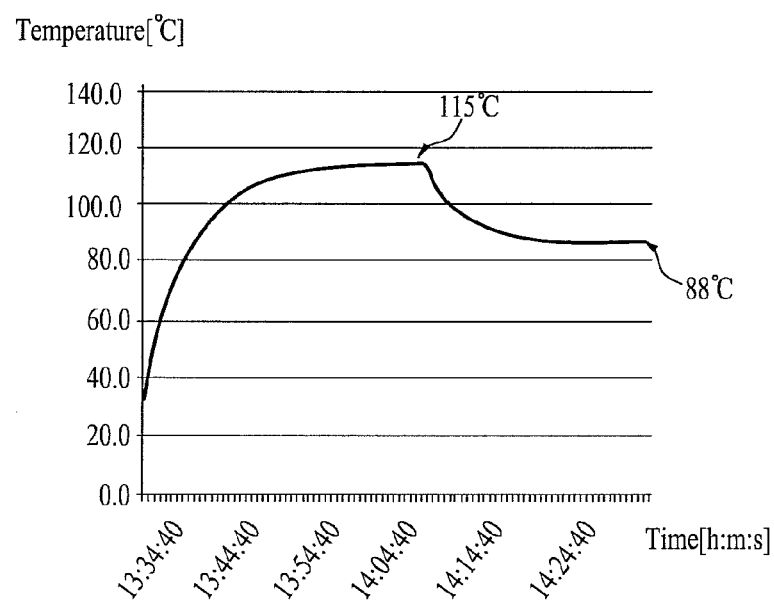
FIGS. 16A and 16B are graphs explaining a radiation effect of the lighting apparatus according to the embodiment of the present disclosure.
Figure 16B:
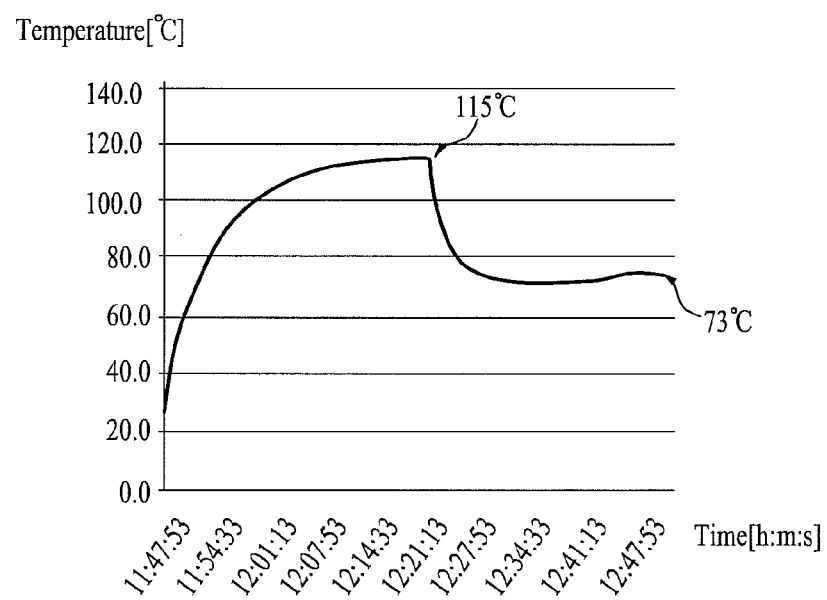

FIG. 16A is data measurements showing heat dissipation embodiment in a radiation effect when the air does not discharge between fins by the active cooling device. FIG. 16B data measurements for FIG. 7 embodiment where vents are formed between fins. The temperature of the lighting apparatus 100 is increases up to 115° by the heat generated from the light emitting module 110. When the active cooling device 130 is put into operation at this point, the temperature of the lighting apparatus 100 is decreased down to 88°. When the active cooling device is put into operation for a heat sink having vents between fins, the temperature further decreases down to 73°.

Figure 17A:
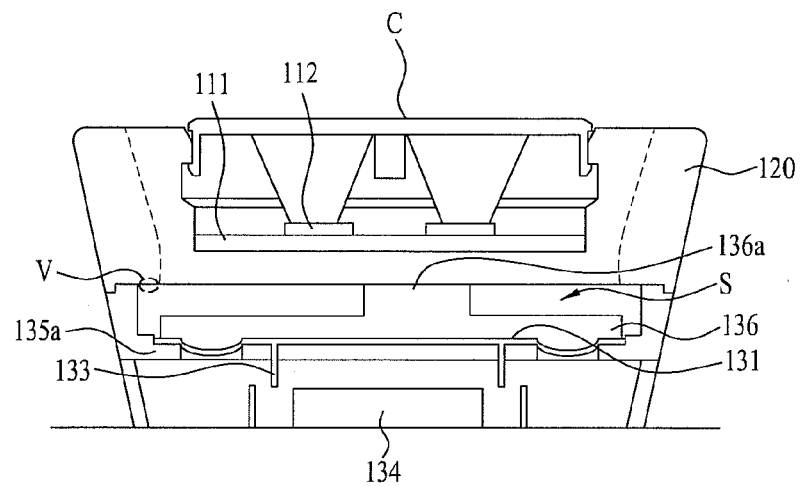
FIG. 17 is a sectional view to explain a first operational state of the active cooling device provided in the lighting apparatus.
Figure 17B:
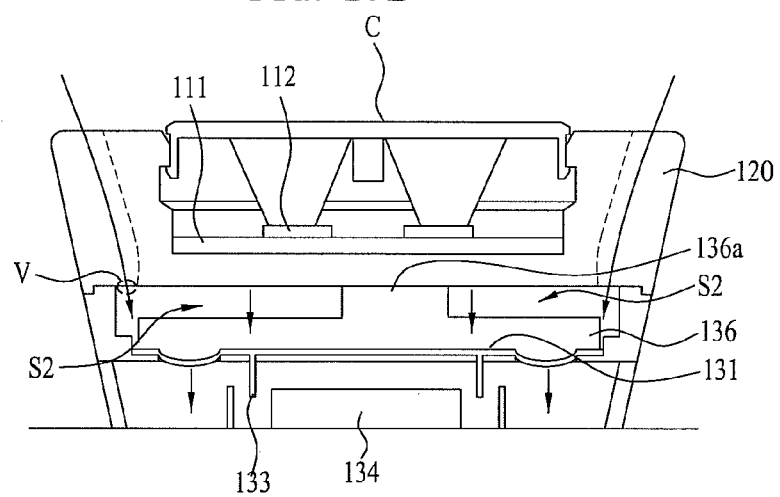
Figure 17C:
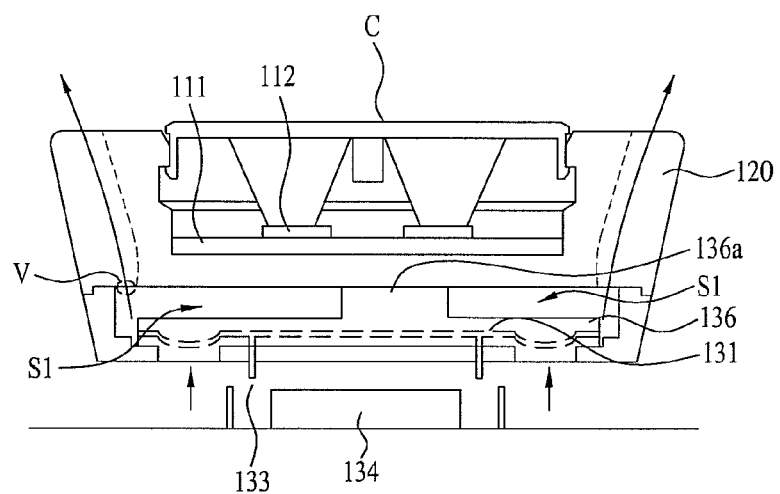

FIGS. 17A-17C are detailed illustrations of movements of the diaphragm 131. In FIG. 17A, when the active cooling device 130 is in its initial position prior to application of power to the coil 133, the space (S) may be defined by the second surface 122 of the heat sink 120, the inner circumferential surface of the housing 135 and the diaphragm 131. The position of the edge portion 131c of the flexible region provided in the diaphragm 131 may be fixed by the seating part 135a and the holder 136 formed in the housing 135.

In FIG. 17B, when an electric power is supplied to the active cooling device 130, the solid region 131a of the diaphragm 131 moves toward the direction closer to the magnet 134, which is fixed in the housing 135. The flexible region 131b of the diaphragm 131 is stretched toward the magnet 134, together with the solid region, and the volume of the space (S1) is increased (S→S2). The seating part is prevented from escaping from the position toward the magnet 134 during the expansion process of the diaphragm 131. The pressure difference with respect to the outside allowing suction of the external air into the space (S2) via the boundary (the vent (v)) between the heat sink 120 and the housing 135.

In FIG. 17C, the solid region 131a of the diaphragm 131 is moved along the direction away from the magnet 134 by the electromagnetic force between the coil 133 and the magnet 134. The flexible region 131b of the diaphragm 131 is stretched toward the opposite direction of the magnet 134, together with the solid region, and the volume of the space (S1) is decreased (S→S1). The holder 136 mentioned above prevents the edge portion 131c from escaping toward the heat sink 120 from the position during the movement of the diaphragm 131 toward the heat sink 120. The pressure difference with respect to the outside makes the internal air of the space (S1) discharged outside via the boundary (the vent (V)) between the heat sink 120 and the housing 135.

Heat exchange is performed between the suctioned or discharged air with the second surface 122 and the outer circumferential surface of the heat sink 120 by air convection. The lighting apparatus 100 according to this embodiment may dissipate the heat generated from the light emitting module 110 effectively. In addition, the air of the space (S1) discharged outside via the vent (V) flows against the outer circumferential surface 123 of the heat sink 120, which increases the heat dissipation effect.

Figure 18A:
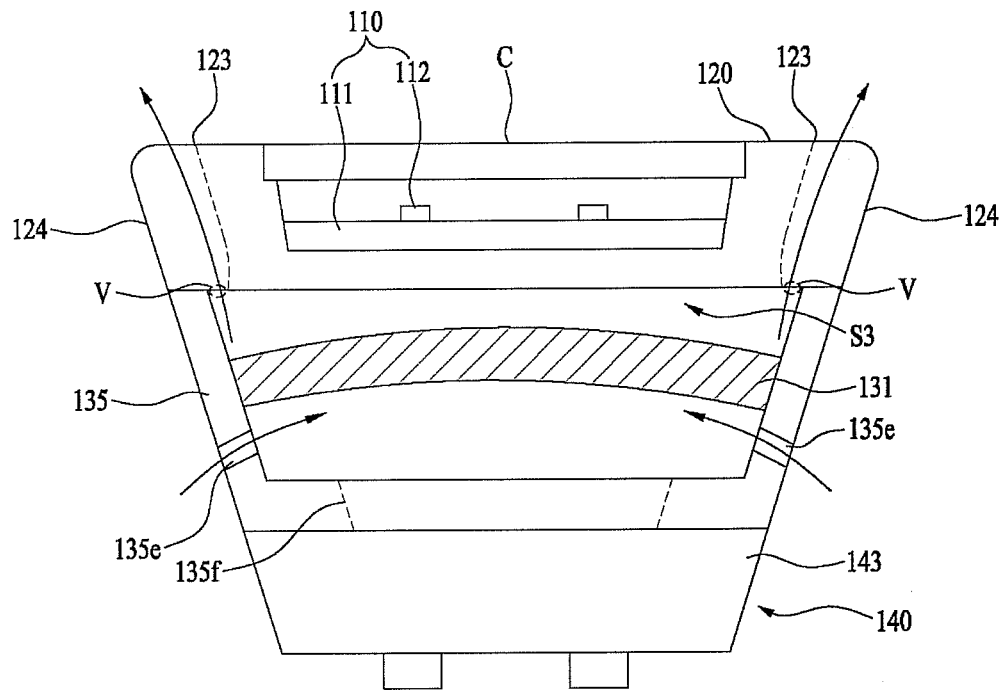
FIGS. 18A and 18b are illustrations to explain various embodiments of the airflow generating part provided in the lighting apparatus according to the present disclosure.
Figure 18B:
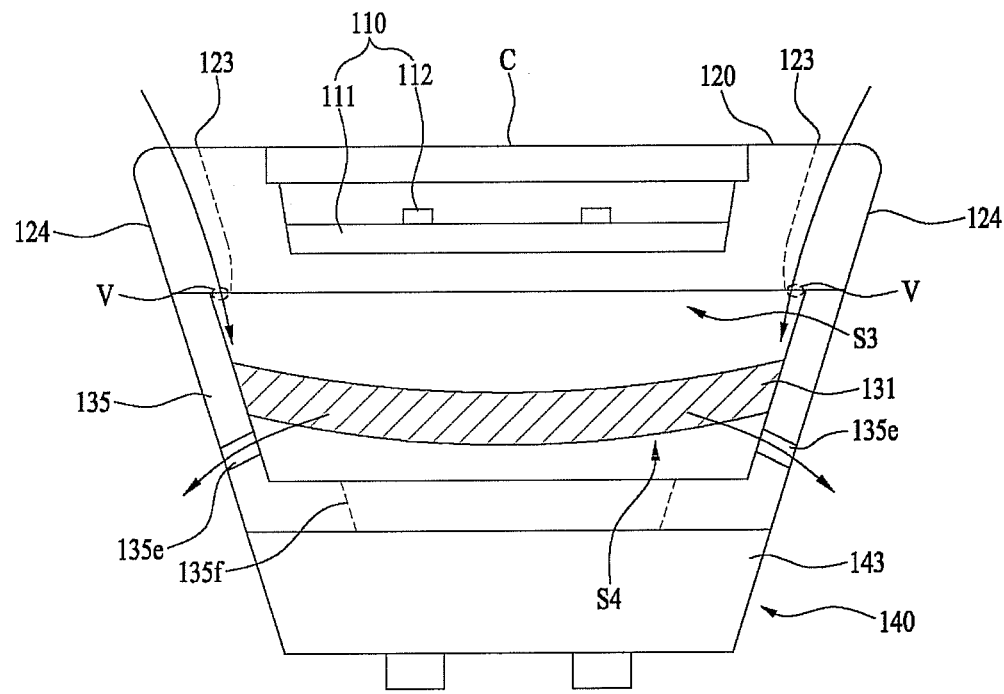

FIGS. 18A and 18b are diagrams to explain operational states of a lighting apparatus according to another embodiment of the present disclosure. This embodiment is a modification of a previous embodiment. As shown in FIG. 18, the housing 135 includes openings 135e. With reference to FIG. 9, the housing 135 has an openings 135f at the bottom and the frame 137 includes openings 137a to allow air or fluid to travel to the electronic module 140.

In the lighting apparatus according to this embodiment, the airflow for dissipating the heat for both of the heat sink 130 and the electronic module 140 is generated by the vibration of the diaphragm 131. The space of the housing 135 may be divided into a first space (S3) located between the diaphragm 131 and the heat sink 120 and a second space (S4) located between the diaphragm 131 and the electronic module 140. The first space (S3) is in communication with the outside via a boundary (V) between the housing 135 and the heat sink 120. The second space (S4) may be in communication with the outside via an opening 135e formed in the housing 135.

The active cooling device 130 is identical to the active cooling device 130 previously described. The structure and the connecting relation between the housing 135 and the heat sink 120 are substantially identical to those of the previous embodiment, and detailed description thereof will be omitted accordingly. The case 143 may be integrally formed with the housing 135.

The driving part 132 may be arranged in the second space (S4) and one of the cables connected with the driving part 132 may be drawn to the first space (S3) from the second space (S4), to be electrically connected with a surface of the diaphragm 131 corresponding to the first space (S3).

In FIG. 18A, when the diaphragm 131 is stretched toward the heat sink 120, air inside the first space (S3) is discharged outside via the boundary (V) and external air is sucked into the second space (S4) via the opening 135b. In FIG. 18b, when the diaphragm 131 is stretched toward the electronic module 140, external air is sucked into the first space (S3) and air inside the second space (S4) is discharged outside via the opening 135b.

The radiation structure of the heat sink 120 which uses the airflow generated in the first space (S3) is identical to the radiation structure previously described. External air and the air inside the second space (S4) dissipates the heat generated from the electronic module 140 outside by the vibration of the diaphragm 131. Both of the heat sink 120 and the electronic module 140 can be radiated simultaneously by using the single diaphragm 131.

Figure 19A:
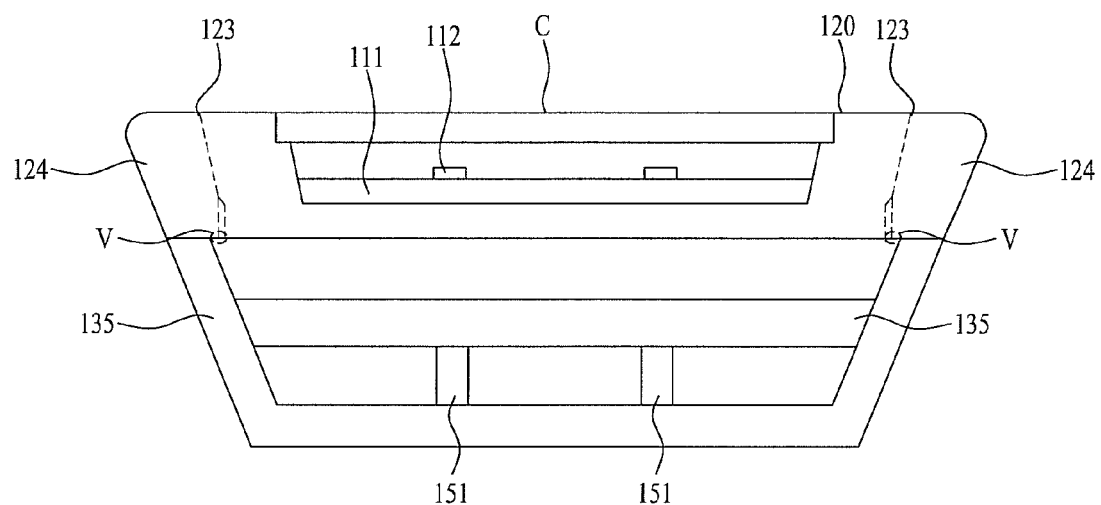
FIGS. 19A and 19 B are illustrations to explain an operational state of a lighting apparatus according to a further embodiment of the present disclosure.
Figure 19B:
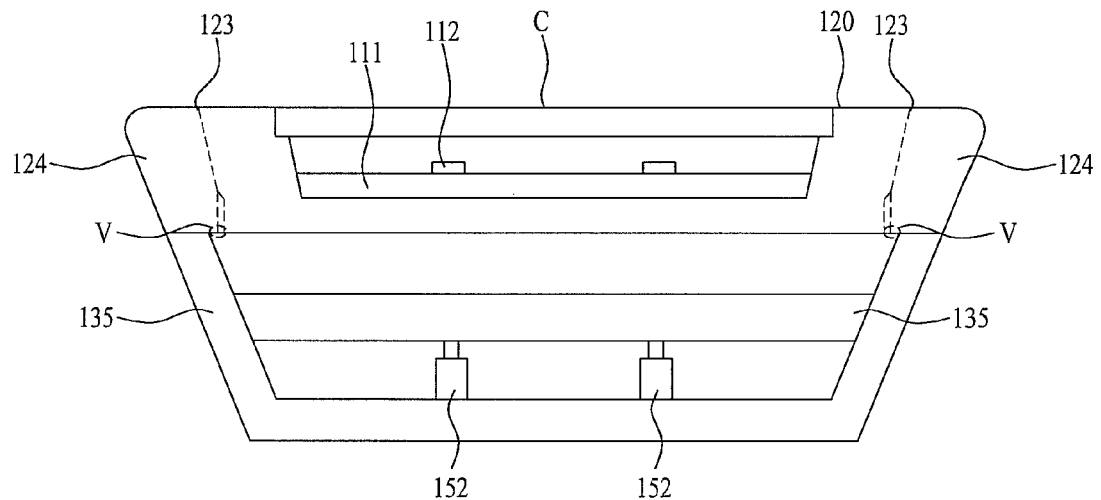

FIGS. 19A and 19B are diagrams illustrating different embodiments of the active cooling device provided in the lighting apparatus according to the present disclosure.

In FIG. 19A, the driving part for vibrating the diaphragm 131 may include at least one piezo-electric element 151. A longitudinal end of the piezo-electric element 151 may be fixed in the housing 135 and the other longitudinal end of the piezo-electric element 151 may be fixed to the solid portion of the diaphragm 131. At this time, when the electric power is supplied to the piezo-electric element 151, the vibration of the diaphragm 131 by deformity generated in the piezo-electric element 151. In FIG. 19B, the driving part configured to vibrate the diaphragm 131 may include at least one cylinder 152. The cylinder 152 may performs piston reciprocation to vibrate the diaphragm 131.

The driving part may have various structures which can vibrate the diaphragm. For example, the driving part may be configured of a motor and a rack gear configured to convert a rotational movement of the motor into a vertical movement of the diaphragm 131.

Figure 20:
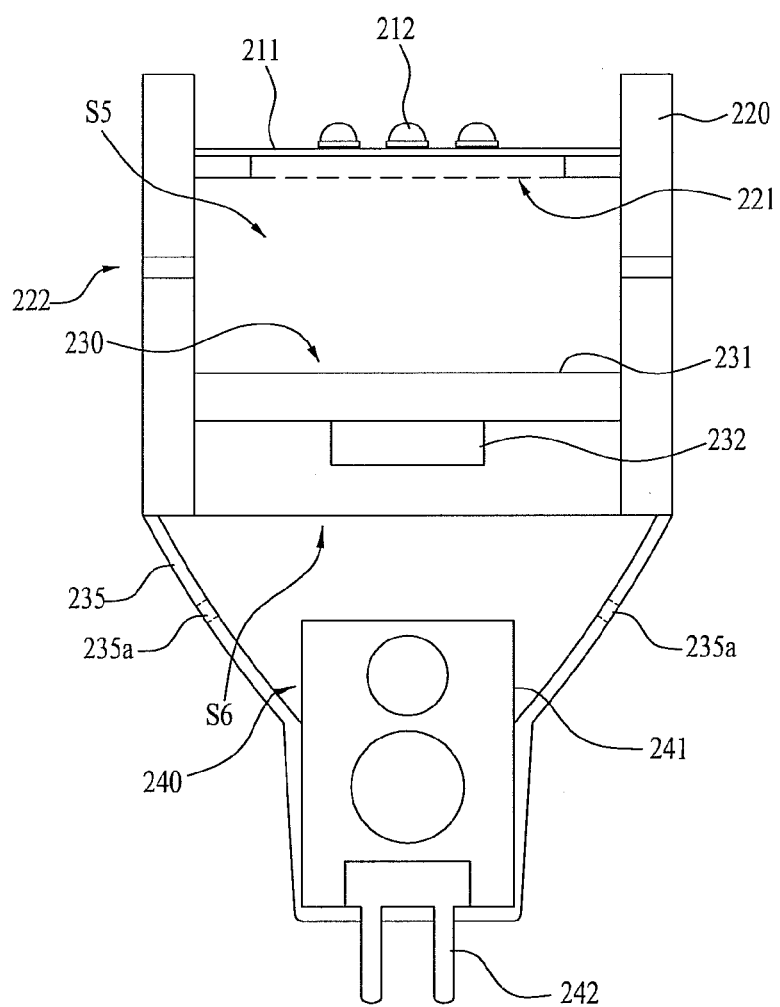
FIG. 20 is a sectional view illustrating a lighting apparatus according to a still further embodiment of the present disclosure.
Figure 21:
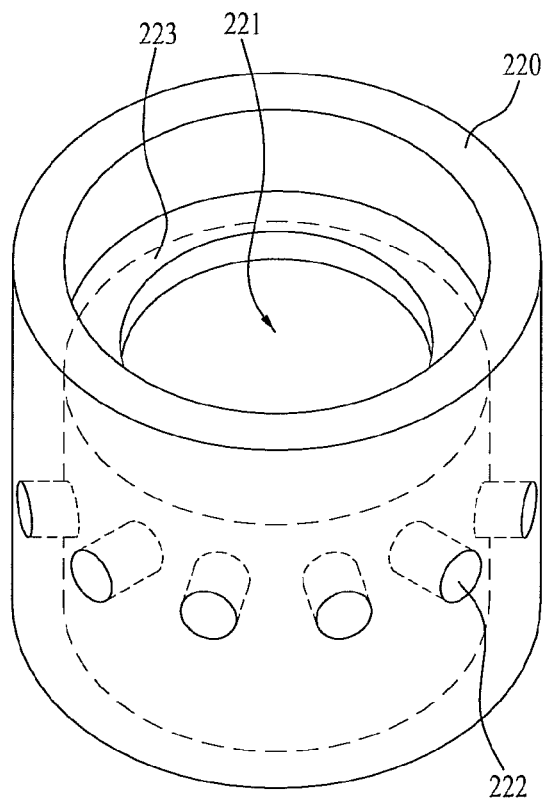
FIG. 21 is a perspective view illustrating a heat sink provided in the lighting apparatus shown in FIG. 20.
Figure 22:
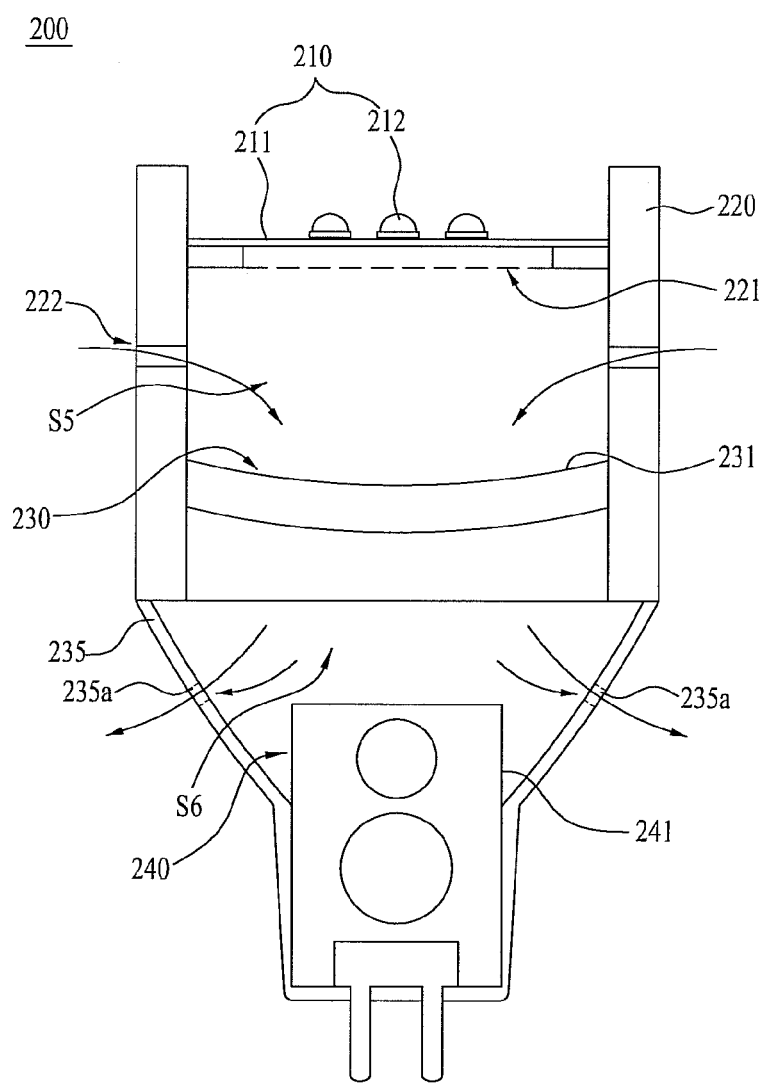
FIGS. 22 and 23 are sectional views to explain an operational state of the lighting apparatus shown in FIG. 20.
Figure 23:
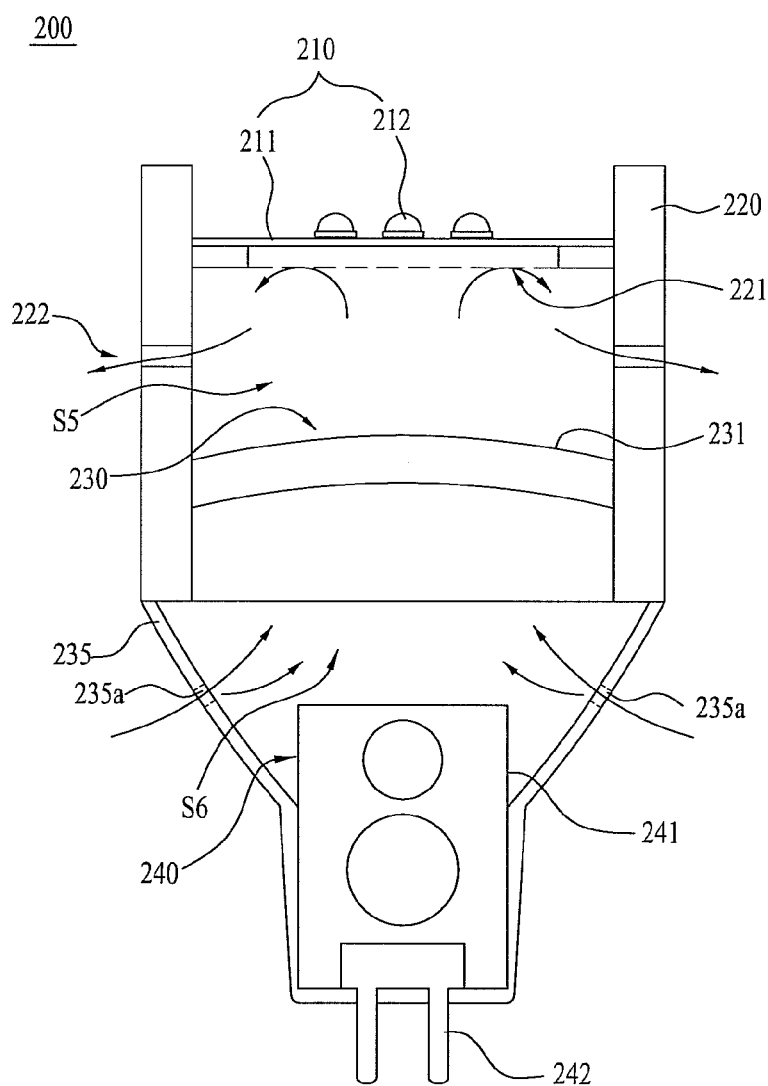

FIG. 20 is a sectional view illustrating a lighting apparatus 200 according to a still further embodiment of the present disclosure and FIG. 21 is a perspective view illustrating a heat sink provided in the lighting apparatus 200 shown in FIG. 20. FIGS. 22 and 23 are sectional views to explain an operational state of the lighting apparatus 200 shown in FIG. 20.

The lighting apparatus 200 according to this embodiment includes a light emitting module 210 having a substrate 211 and an LED element 212 mounted on the substrate 211. The light emitting module 210 is mounted on a heat sink 220, and the heat sink 220 has a through hole 221 to expose a predetermined portion of the substrate 211 and a plurality of openings 222 formed in an outer circumferential surface thereof. An active cooling device 230 is arranged in the heat sink 220 to form a space (S5) with the substrate 211. The active cooling device 230 generates airflow used to radiate the light emitting module 210 by changing a volume of the space (S5).

The airflow generated by the active cooling device 130 described in the above embodiments dissipate the heat by the air convection between the second surface 122 of the heat sink 120 and the radiation fins 124, not direct heat emitted by the light emitting module 110. According to this embodiment, the airflow generated from the active cooling device 230 is provided directly to the light emitting module 210 by convection. The active cooling device 230 and electronic module 240 are same as the previous embodiment.

The active cooling device 230 may include a diaphragm 231 and a driving part 232 for vibrating the diaphragm 231.

Furthermore, the active cooling device 230 may include a housing 235 mounted to the heat sink 220 to form a predetermined space.

The diaphragm 231 may be arranged in the heat sink 220 or the housing 235. The diaphragm 231 provided in the heat sink 220 may generate a stronger airflow toward the light emitting module 210 than if the diaphragm is provided in the housing.

In addition, the electronic module 240 may include a socket 242 exposed outside the housing 235 to be connected with an external power supply and a circuit part 242 arranged in the housing 235.

As illustrated in FIGS. 20 and 21, the heat sink 220 may have a hollow cylindrical shape and it may have a plurality of radiation fins arranged at an outer circumferential surface thereof. The heat sink 220 may have a ring-shaped seating part 223 to seat the light emitting module there to, a through hole 221 to expose a predetermined portion of the substrate 211 to the diaphragm 231, and a plurality of openings 222 formed at an outer circumferential surface of the heat sink 220 to communicate the space (S5) formed between the substrate 211 and the diaphragm 231 with the outside.

As illustrated in FIGS. 22 and 23, when the diaphragm 231 is expanded along an opposite direction of the light emitting module 210, external air is sucked into the space (S5) via the openings 222. When the diaphragm 231 is expanded toward the light emitting module 210, internal air of the space (S5) is discharged outside via the openings 222. Because of the air suction and discharge, the heat generated from the light emitting module 210 may be dissipated to the outside.

According to an embodiment varied from this embodiment, a lighting apparatus 200 includes a light emitting module 210 having a substrate 211 and an LED element 212 mounted on the substrate 211, an air generation device 230 having a diaphragm 231 for generating airflow toward a predetermined portion of the substrate 211 and a driving part 232 for vibrating the diaphragm 231, and a electronic module 240 electrically connected with the driving part 232 and the light emitting module 210. Here, the light emitting module 210 is mounted in the diaphragm 231 and the diaphragm 231 has a through hole 221 to expose the predetermined portion of the substrate 211 and a plurality of openings 222 formed at an outer circumferential surface of the diaphragm 231.

In addition, the diaphragm 231 forms a space (S5) with the substrate 211 and the active cooling device 230 generates airflow to radiate the light emitting module 210 and the electronic module 240 by changing a volume of the space (S5).

The lighting apparatus 200 includes a housing 245 for accommodating the electronic module 240, being mounted to the heat sink. The diaphragm 231 may be arranged within the heat sink 220 or within the housing 235 if the heat sink is not high enough. The space may be divided into a first space (S5) located between the diaphragm 231 and the substrate 211 and a second space (S6) located between the diaphragm 231 and the electronic module 240. The first space (S5) may be in communication with the outside via the first opening 222 and the second space (S6) may be in communication with the outside via a second opening 235a formed in the housing 235.

In reference to FIG. 22, when the diaphragm 231 is expanded toward the substrate 211, air inside the first space (S5) is discharged outside via the first opening 222 and external air is sucked into the second space (S6) via the second opening 235a. In reference to FIG. 23, when the diaphragm 231 is expanded toward the electronic module 240, external air is sucked into the first space (S5) via the first opening 222 and air inside the second space (S6) is discharged outside via the second opening (S235a). As a result, both of the heat sink 120 and the electronic module 140 can be simultaneously radiated by using the single diaphragm 231. The lighting apparatus 200 according to this embodiment has an excellent radiation effect.

Figure 24:
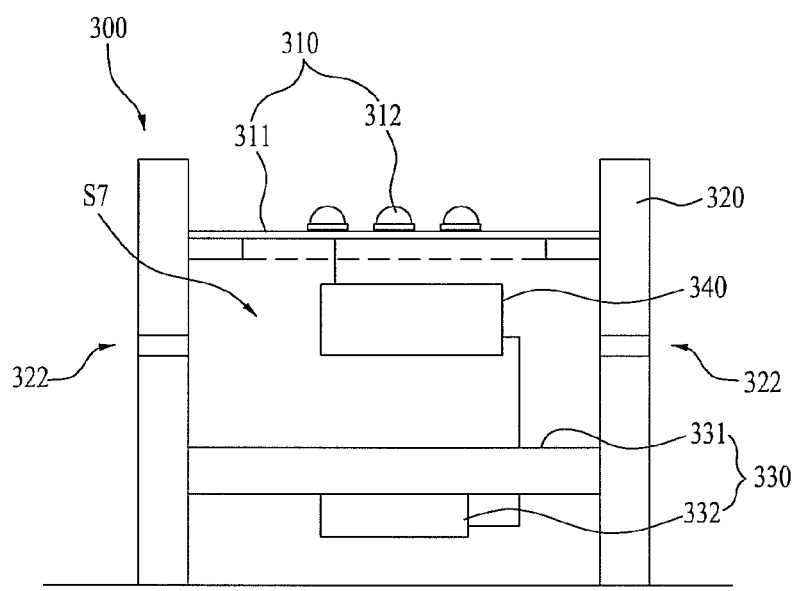
FIG. 24 is a sectional view partially a lighting apparatus according to another embodiment of the present disclosure.

FIG. 24 is a sectional view partially illustrating a lighting apparatus 300 according to a still further embodiment of the present disclosure. A light emitting module 310 has a substrate 311 and an LED element 312 mounted on the substrate 311. A heat sink 320 has a first surface where the light emitting module 310 is mounted and a second surface located in opposite to the first surface. An active cooling device 330 is mounted to the second surface of the heat sink 320 to form a space (S7), with generating airflow toward the space (S7) to use the airflow to radiate the heat sink 320. An electronic module 340 is mounted in the space (S7), with being electrically connected with the light emitting module 310 and the active cooling device 330. The active cooling device 330 radiates the heat sink 330 and the electronic module 340 by changing a volume of the space (S7).

As described in FIG. 3, the active cooling device 330 may have the structure configured of the first surface having the recess part, the second surface located in opposite to the first surface and the outer circumferential surface connecting the first and second surfaces with each other. As shown in FIG. 20, it may have the structure configured of the through hole to expose the predetermined portion of the substrate inwardly.

Different from the above embodiments, this embodiment represents that the electronic module 340 of the lighting apparatus 300 is arranged in the space between the second surface of the heat sink and the diaphragm 331.

Specifically, it may be understood that the electronic module 340 according to this embodiment refers to only the circuit part (141, for example) described in reference to the above embodiments and the socket used to connect the electronic module 340 with the external power supply may be provided independently.

In addition, the vent for communicating the space (S7) with the outside may be the boundary between the heat sink and the housing as described in reference to FIG. 7 or an opening formed at the outer circumferential surface of the heat sink.

Under this structure, the electronic module 340 is arranged in the space located between the diaphragm 331 and the substrate 311. The size of the lighting apparatus 300 may be reduced and electricity loss generated in the power supply to the light emitting module 310 may be reduced.

Figure 25:
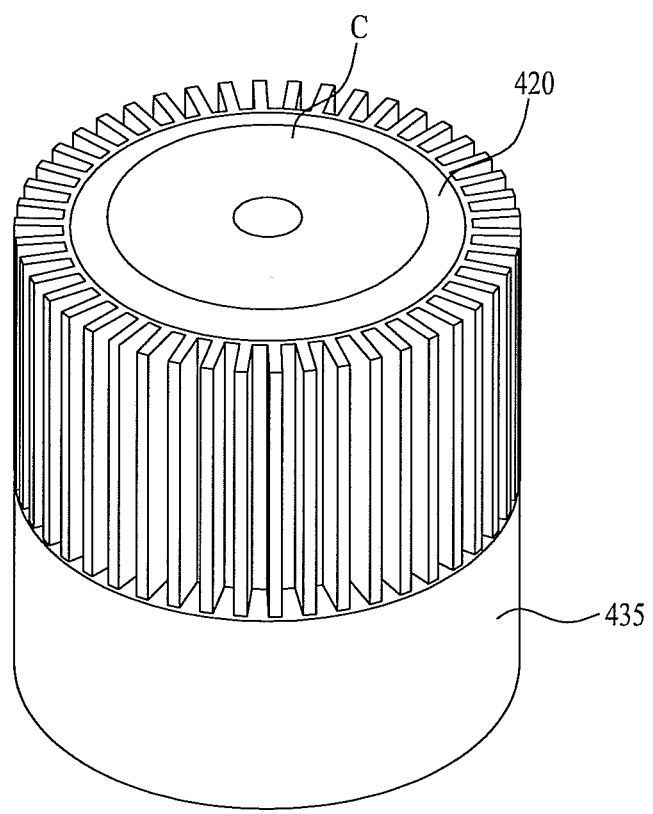
FIG. 25 is a perspective view illustrating a lighting apparatus according to another embodiment of the present disclosure.
Figure 26:
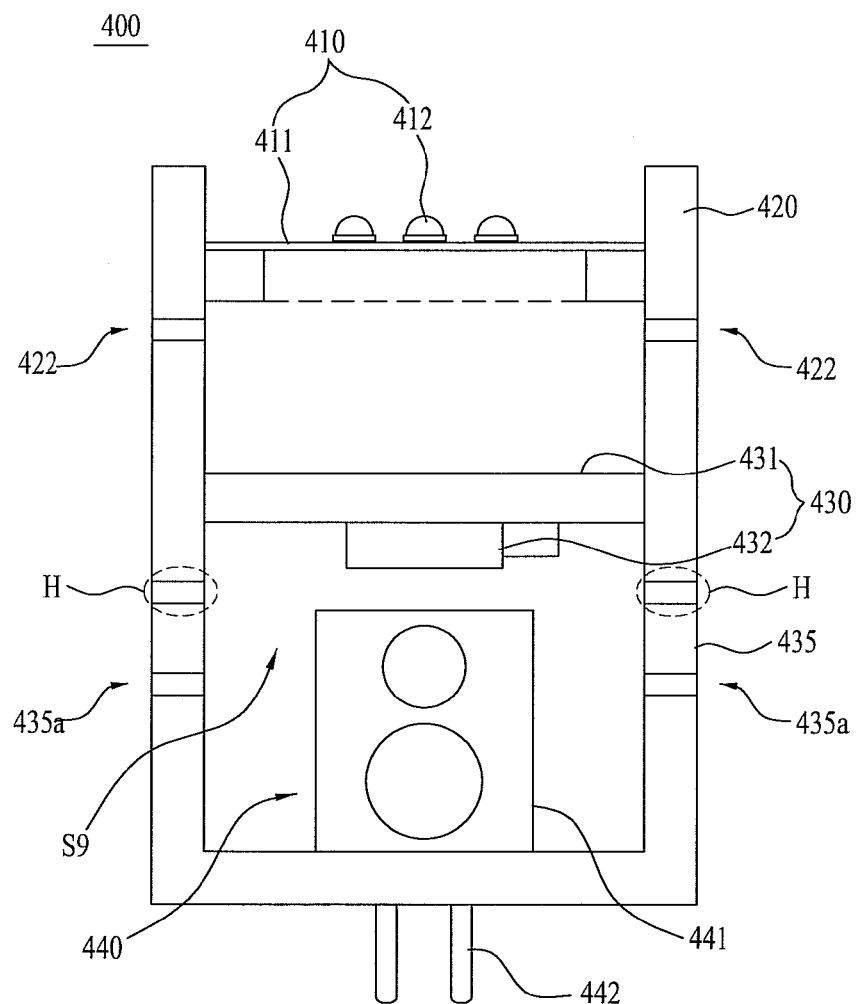
FIG. 26 is a sectional view illustrating the lighting apparatus shown in FIG. 25.

FIG. 25 is a perspective view illustrating a lighting apparatus 400 according to a still further embodiment of the present disclosure and FIG. 26 is a sectional view illustrating the lighting apparatus 400 shown in FIG. 25.

A light emitting module 410 has a substrate 411, and an LED element 412 mounted on the substrate 411, and the light emitting module 410 is mounted on a first heat sink 420. A second heat sink 435 is mounted to the first heat sink 420 (S9). An active cooling device 430 has a diaphragm 431 arranged in the space, which is divided into spaces (S8 and S9) and a driving part for vibrating the diaphragm 431. An electronic module 440 is arranged in the second heat sink 435, with being electrically connected with the driving part 432 and the light emitting module 410.

Airflow is generated in the space by the vibration of the diaphragm 431, to radiate the first heat sink 420 and the second heat sink 435. The first heat sink 420 and the second heat sink 435 may be formed of the same material, to enhance radiation efficiency. The first heat sink 420 may have the structure configured of the first surface having the recess part where the light emitting module is mounted, the second surface in opposite to the first surface and the outer circumferential surface connecting the first surface and the second surface with each other, as shown in FIG. 3, or the structure configured of the through hole for exposing the predetermined portion of the substrate inwardly and the opening formed at the outer circumferential surface, as shown in FIG. 20.

When the first heat sink 420 has the structure configured of the through hole for exposing the predetermined portion of the substrate inwardly and the opening formed at the outer circumferential surface as shown in FIG. 20, the diaphragm 431 may be arranged in the first heat sink 420 and the space (S8) formed between the diaphragm 421 and the light emitting module 410 may be communicate with the outside via the opening 422.

In contrast, when the first heat sink 420 has the structure configured of the first surface having the recess part where the light emitting module is mounted, the second surface in opposite to the first surface and the outer circumferential surface connecting the first surface and the second surface with each other as shown in FIG. 3, the diaphragm 431 may be arranged in the second heat sink 435 and the space (S8) formed between the diaphragm 431 and the second surface of the first heat sink may communicate with the outside via a boundary (H) between the first heat sink 420 and the second heat sink 435.

According to the radiation structure of the lighting apparatus 400 of this embodiment, for example, when the diaphragm 431 is expanded toward the first heat sink 420, air inside the space (S8) may be discharged outside the boundary between the first heat sink 420 and the second heat sink 435 or the opening 422 formed at the outer circumferential surface of the first heat sink 420. When the diaphragm is expanded toward the opposite direction of the first heat sink 420, external air may be sucked into the space via the boundary (H) between the first heat sink 420 and the second heat sink 435 or the opening 422 formed at the outer circumferential surface of the first heat sink 420.

With respect to the diaphragm 431 may be formed an upper space (S8) between the diaphragm 431 and the first heat sink 420 and a lower space between the diaphragm 431 and the second heat sink 435. The upper space (S8) may be in communication with the outside the boundary between the first heat sink 420 and the second heat sink 435 or the opening 422 formed at the outer circumferential surface of the first heat sink 420. The lower space (S9) may be in communication with the outside via the opening 435a formed at the outer circumferential surface of the second heat sink 435. At this time, the second heat sink 435 may be corresponding to the housing 135 described in reference to FIG. 3.

In the lighting apparatus 400 according to this embodiment, the first heat sink 420 and the second heat sink 435 are formed of the same metal material. Because of that, radiation efficiency may be enhanced and a radiation area may be increased effectively. The light emitting module provided in the lighting apparatus according to the present disclosure will be explained in detail in reference to the accompanying drawings.

Figure 27A:
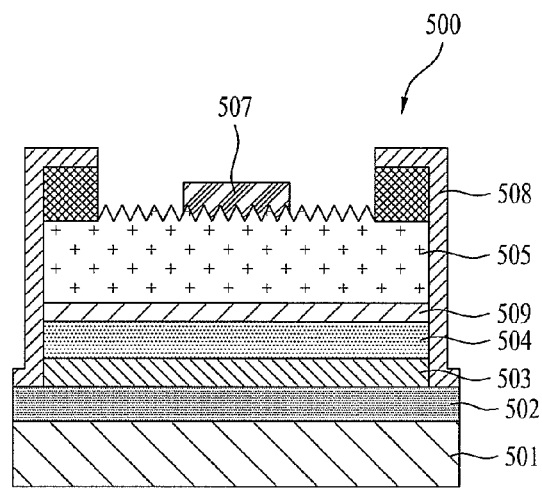
FIGS. 27A and 27B are illustrations of a light emitting module provided in the lighting apparatus according to the embodiment of the present disclosure.
Figure 27B:
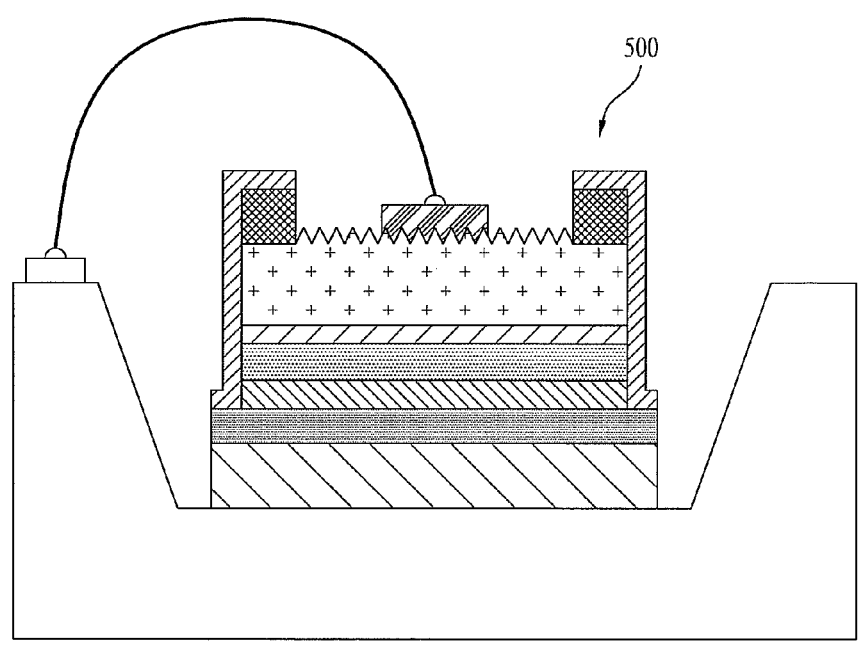

FIG. 27A is a diagram illustrating a light emitting module 500 including the thin GaN LED. FIG. 27B illustrates mounting of the LED on a package substrate. The thin GaN LED 500 may include an active layer 509 for emitting a light and two cladding layers 504 and 505 for surrounding the active layer 509. The cladding layers 504 and 505 in contact with an electrode 507 may be p-doped (504) or n-doped (505). The thin GaN LED 500 may further include a supporter 501, a solder layer 502, a projection member 508 and a reflection layer 503 provided under the cladding layers 504 and 505.

In the light emitting module 110 according to the embodiment of the present disclosure, the LED may grow on a silicon substrate, a sapphire substrate, a SiC substrate or a GaN substrate. For example, the sapphire substrate is an electric insulator, with a low thermal conductivity and a high melting point. Because of that, it is proper as a substrate of a thin film deposited at a high temperature, with a physical property good resistance to various wet etch types.

As may be known to one of ordinary skill in the art, heat sinks are passive cooling devices, e.g., use of large surface area using a material with good heat dissipation properties. An active cooling device is different from a passive cooling device in that electrical power is applied to cause movement of parts resulting in fluid flow. The fluid may be air or any appropriate medium. An electro-mechanical actuator may be considered as an active cooling device.

The lighting apparatus according to the present disclosure may emit the heat generated from the light emitting module effectively.

The lighting apparatus according to the present disclosure may radiate the light emitting module and the heat sink by using conduction and convection.

The lighting apparatus according to the present disclosure may form the vent naturally, in the state of the heat sink coupled to the active cooling device.

The lighting apparatus according to the present disclosure may radiate the heat sink and the light emitting module directly or indirectly. Simultaneously, the lighting apparatus may radiate the electronic module.

A lighting apparatus comprises a heat sink having first and second surfaces, which are opposite sides, and a plurality of fins, which extend a prescribed distance from a circumference of the heat sink, and a prescribed gap provided between adjacent fins, a light emitting module having at least one light emitting diode provided on the first surface of the heat sink, an active cooling device to dissipate heat by convection, the active cooling device having a housing mated to the fins on the second side of the heat sink and the housing having a wall of a prescribed width which is less than the prescribed distance of the fins such that vents are provided between the adjacent fins, the active cooling device further including a diaphragm provided in the housing such that a space is provided between the diaphragm and the heat sink and a driving module to move the diaphragm in first and second directions, which are opposite directions, wherein movement of the diaphragm in the first and second directions changes a volume of the space causing air in the space to be discharged through the vents when the diaphragm moves toward the heat sink in the first direction and suctioning air from outside into the space when the diaphragm moves away from the heat sink in the second direction.

It will be apparent to those skilled in the art that various modifications and variations can be made in the present disclosure without departing from the spirit or scope of the inventions. Thus, it is intended that the present disclosure covers the modifications and variations of this invention provided they come within the scope of the appended claims and their equivalents.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

What is claimed is:

1. A lighting apparatus comprising:
a heat sink having first and second surfaces, which are opposite sides, and a plurality of fins, which extend a prescribed distance from a circumference of the heat sink, and a prescribed gap provided between adjacent fins;
a light emitting module having at least one light emitting diode provided on the first surface of the heat sink;
an active cooling device to dissipate heat by convection, the active cooling device having a housing mated to the fins on the second side of the heat sink and the housing having a wall thickness which is less than the prescribed distance of the fins such that vents are formed by an area difference between the fins of the heat sink and the wall thickness of the housing at a boundary between the heat sink and the housing, the active cooling device further including a diaphragm provided in the housing such that a first space is provided between the diaphragm and the heat sink and a driving module to move the diaphragm in first and second directions, which are opposite directions, wherein movement of the diaphragm in the first and second directions changes a volume of the first space causing air in the first space to be discharged through the vents formed between the adjacent fins when the diaphragm moves toward the heat sink in the first direction and suctioning air from outside into the first space when the diaphragm moves away from the heat sink in the second direction;
an electronic module is provided in the housing of the active cooling device such that the electronic module is provided between the diaphragm and a bottom of the housing,
wherein a second space is defined between the diaphragm and the electronic module, and the second space is in communication with the outside via at least one opening formed in the housing, and
wherein a slope portion is provided in the circumference of the heat sink to deflect the air discharged through the vents between the heat sink and the housing, and the slope portion is oblique downwardly toward the housing,
wherein a plurality of projections are provided on the housing to form a vent for suction and discharge of air via a boundary between the heat sink and the housing, and
wherein the driving module includes a coil provided on the diaphragm and a magnet provided on the housing, the coil is provided on a lower surface of the diaphragm facing the magnet, and a cable connected with the driving module is electrically connected with a pad on an upper surface of the diaphragm.

2. The lighting apparatus of claim 1, wherein the coil is configured to receive an alternating current to cause attraction or repulsion between the coil and the magnet, the attraction causing the diaphragm to move away from the heat sink and the repulsion causing the diaphragm to move toward the heat sink.

3. The lighting apparatus of claim 1, wherein the diaphragm comprises a rigid central portion and a flexible outer portion extending in a radial direction.

4. The lighting apparatus of claim 3, wherein the coil is provided on the rigid central portion.

5. The light apparatus of claim 1, wherein the housing includes a ridge to serve as seat portion to receive the diaphragm.

6. The lighting apparatus of claim 5, wherein the active cooling device includes a holder between the heat sink and the diaphragm and provide to press the diaphragm against the seat portion.

7. The lighting apparatus of claim 6, wherein the holder includes a plurality of protrusions to serve as spacers.

8. The lighting apparatus of claim 1, wherein the active cooling device further includes a frame attached to the housing and having openings, the magnet being attached to the frame.

9. The lighting apparatus of claim 1, further comprising an electronic module to supply external power to the driving module of the active cooling device and the light emitting module.

10. The lighting apparatus of claim 9, wherein the electronic module conditions the external power to provide an alternating voltage is provided to the active cooling device and a DC voltage to the light emitting module.

11. The lighting apparatus of claim 9, further comprising a case attached to a bottom of the housing and the electronic module being provided in the case.

12. The lighting apparatus of claim 3, wherein the rigid central portion and the flexible outer portion are formed of different materials.

13. The lighting apparatus of claim 7, wherein the plurality of protrusions contact the heat sink.

14. The lighting apparatus of claim 3, wherein the rigid central portion of the diaphragm to move close to and away from the magnet based on an electromagnetic force between the coil and the magnet, and the flexible outer portion of the diagram to allow movement of the rigid central portion of the diagram toward and away from the magnet based on changing magnetic field caused by alternate current flow when an alternating voltage is applied to the coil.

15. The lighting apparatus of claim 14, wherein the alternating magnetic field creates either attraction or repulsion between the magnetic field of the coil and the magnetic field that has a fixed magnetic polarity, and the repetitive attraction and repulsion and the flexible outer portion allows the rigid central portion to vibrate up and down and change a volume of the space.

16. A lighting apparatus comprising:
a heat sink having first and second surfaces, which are opposite sides, and a plurality of fins, which extend a prescribed distance from a circumference of the heat sink, and a prescribed gap provided between adjacent fins;
a light emitting module having at least one light emitting diode provided on the first surface of the heat sink;
an active cooling device to dissipate heat by convection, the active cooling device having a housing mated to the fins on the second side of the heat sink and the housing having a wall thickness which is less than the prescribed distance of the fins such that vents are formed by an area difference between the fins of the heat sink and the wall thickness of the housing at a boundary between the heat sink and the housing, the active cooling device further including a diaphragm provided in the housing such that a first space is provided between the diaphragm and the heat sink and a driving module to move the diaphragm in first and second directions, which are opposite directions, wherein movement of the diaphragm in the first and second directions changes a volume of the first space causing air in the first space to be discharged through the vents formed between the adjacent fins when the diaphragm moves toward the heat sink in the first direction and suctioning air from outside into the first space when the diaphragm moves away from the heat sink in the second direction;

an electronic module is provided in the housing of the active cooling device such that the electronic module is provided between the diaphragm and a bottom of the housing, wherein a second space is defined between the diaphragm and the electronic module, and the second space is in communication with the outside via at least one opening formed in the housing, and wherein a slope portion is provided in the circumference of the heat sink to deflect the air discharged through the vents between the heat sink and the housing, and the slope portion is oblique downwardly toward the housing, wherein a plurality of projections are provided on the housing to form a vent for suction and discharge of air via a boundary between the heat sink and the housing, and wherein the driving module includes a coil provided on a solid region of the diaphragm and a magnet provided on an inside of the housing, the coil is provided on a lower surface of the solid region of the diaphragm facing the magnet, and a cable connected with the driving module is electrically connected with a pad on an upper surface of the diaphragm, wherein the solid region of the diaphragm to move close to and away from the magnet based on an electromagnetic force between the coil and the magnet, and a flexible region of the diagram allows movement of the solid region of the diagram toward and away from the magnet based on changing magnetic field caused by alternate current flow when an alternating voltage is applied to the coil.

17. The lighting apparatus of claim 16, wherein the alternating magnetic field creates either attraction or repulsion between the magnetic field of the coil and the magnetic field that has a fixed magnetic polarity, and the repetitive attraction and repulsion and the flexible region allows the solid region to vibrate up and down and change a volume of the space.

* * * * *